United States Patent
Aihara et al.

(10) Patent No.: US 9,554,455 B2
(45) Date of Patent: Jan. 24, 2017

(54) METHOD AND APPARATUS FOR REDUCING FAR-END CROSSTALK IN ELECTRICAL CONNECTORS

(71) Applicant: HIROSE ELECTRIC CO., LTD., Yokohama-shi, Kanagawa (JP)

(72) Inventors: Kunia Aihara, San Jose, CA (US); Ching-Chao Huang, San Jose, CA (US)

(73) Assignee: HIROSE ELECTRIC CO., LTD., Yokohama-Shi, Kanagawa (JP)

( * ) Notice: Subject to any disclaimer, the term of this patent is extended or adjusted under 35 U.S.C. 154(b) by 0 days.

(21) Appl. No.: 14/707,965

(22) Filed: May 8, 2015

(65) Prior Publication Data

US 2015/0357760 A1    Dec. 10, 2015

Related U.S. Application Data

(60) Provisional application No. 62/009,801, filed on Jun. 9, 2014.

(51) Int. Cl.
| | |
|---|---|
| *H01R 12/00* | (2006.01) |
| *H05K 1/02* | (2006.01) |
| *H05K 1/11* | (2006.01) |
| *H01R 13/6469* | (2011.01) |

(52) U.S. Cl.
CPC ........ *H05K 1/0228* (2013.01); *H01R 13/6469* (2013.01); *H05K 1/115* (2013.01); *H05K 1/0245* (2013.01)

(58) Field of Classification Search
CPC .... H05K 1/0228; H05K 1/115; H05K 1/0245; H01R 13/6469

USPC ............................................................ 439/55
See application file for complete search history.

(56) References Cited

U.S. PATENT DOCUMENTS

| | | | |
|---|---|---|---|
| 7,217,889 B1 | 5/2007 | Parameswaran et al. | |
| 9,069,910 B2* | 6/2015 | Zhang | G06F 13/4022 |
| 2007/0207674 A1* | 9/2007 | Minich | H01R 12/724 |
| | | | 439/607.1 |
| 2009/0180266 A1* | 7/2009 | Kirk | H05K 1/0228 |
| | | | 361/784 |
| 2010/0323535 A1* | 12/2010 | Brolin | H01R 13/6467 |
| | | | 439/62 |
| 2011/0053431 A1* | 3/2011 | Bopp | H01R 13/6658 |
| | | | 439/676 |
| 2011/0104913 A1* | 5/2011 | Hinkle | H01R 12/57 |
| | | | 439/68 |
| 2012/0161893 A1* | 6/2012 | Ye | H01P 3/026 |
| | | | 333/5 |

* cited by examiner

*Primary Examiner* — Jean F Duverne
(74) *Attorney, Agent, or Firm* — Procopio, Cory, Hargreaves & Savitch LLP

(57) ABSTRACT

Systems, methods and apparatuses involving a chip-to-chip communication channel, for reducing Far End Crosstalk (FEXT) through the novel concept of controlling FEXT magnitude and polarity of a component inside a channel, vias or within a connector by implementing broadside and edge couplings to offset cumulative FEXT in a channel, via-connector-via subsystem or a connector. The example implementations described herein can be applied to a chip-to-chip communication channel, mezzanine connectors, backplane connectors and any other connectors requiring via routing, and connector itself that can benefit from FEXT reduction.

16 Claims, 21 Drawing Sheets

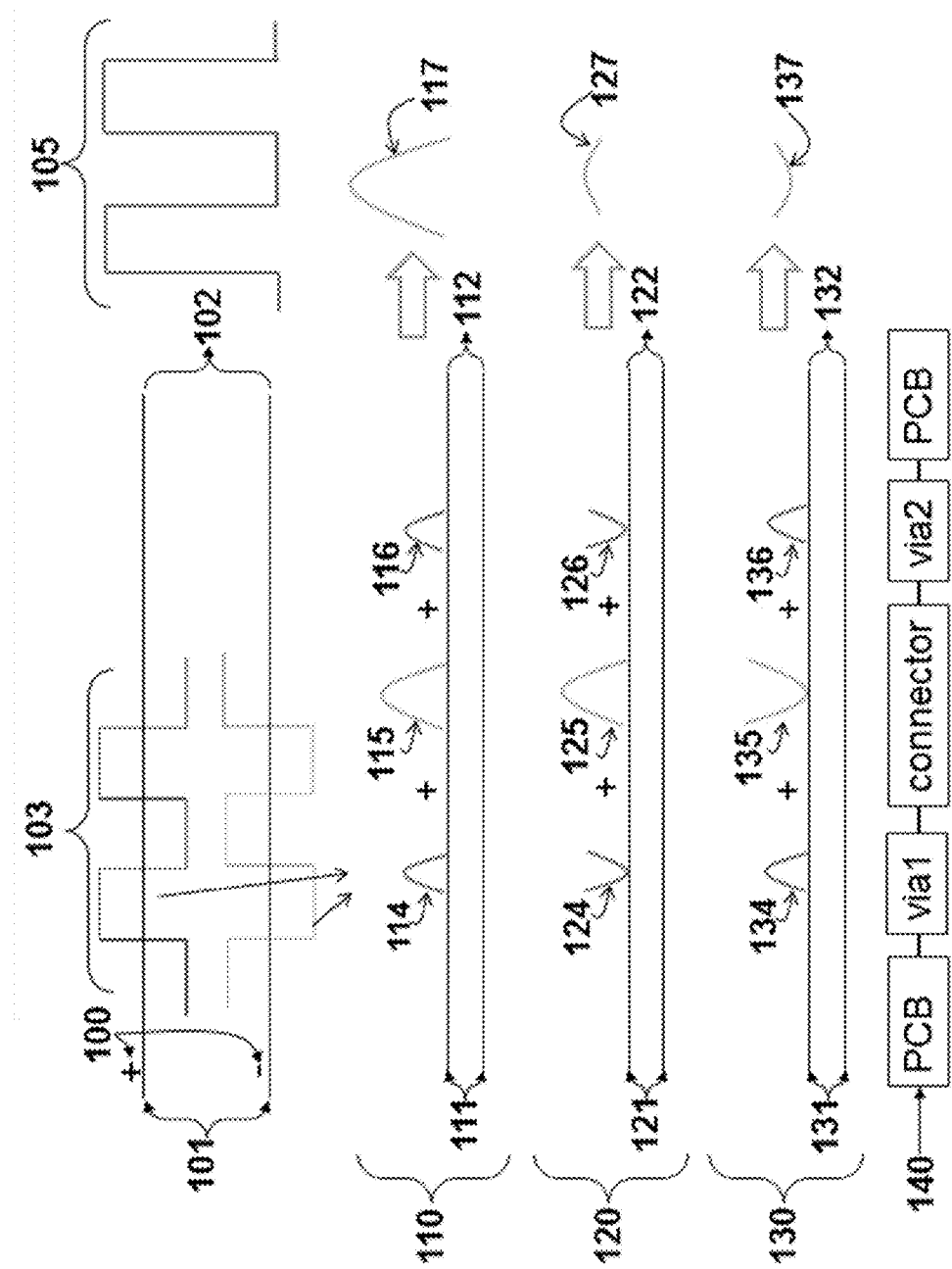
FIG. 1

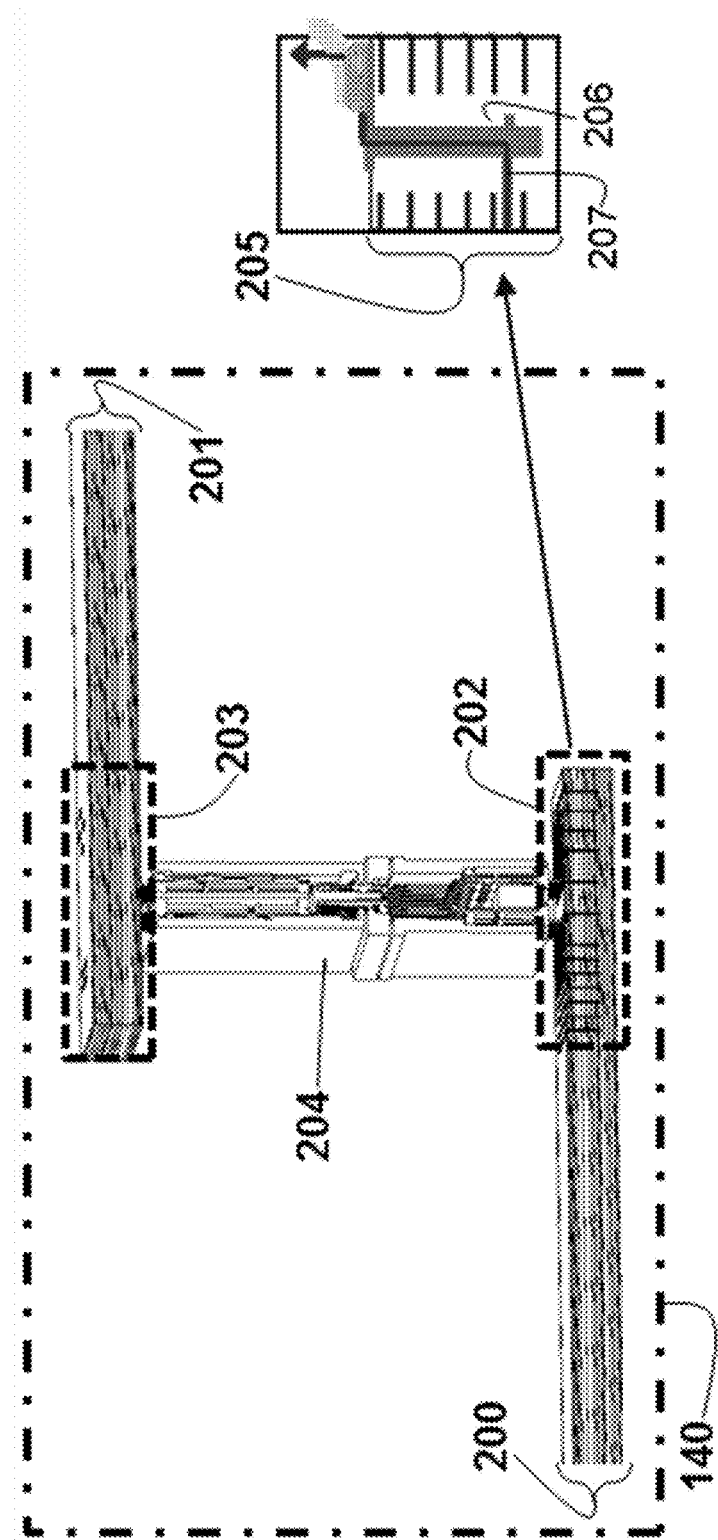
FIG. 2

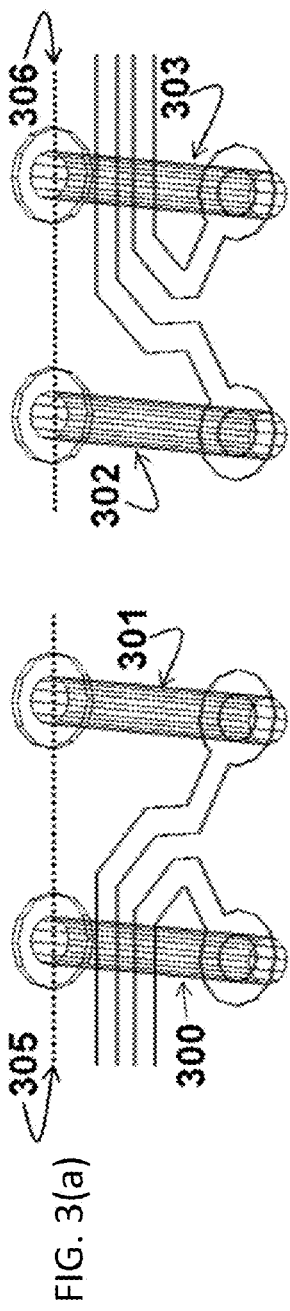
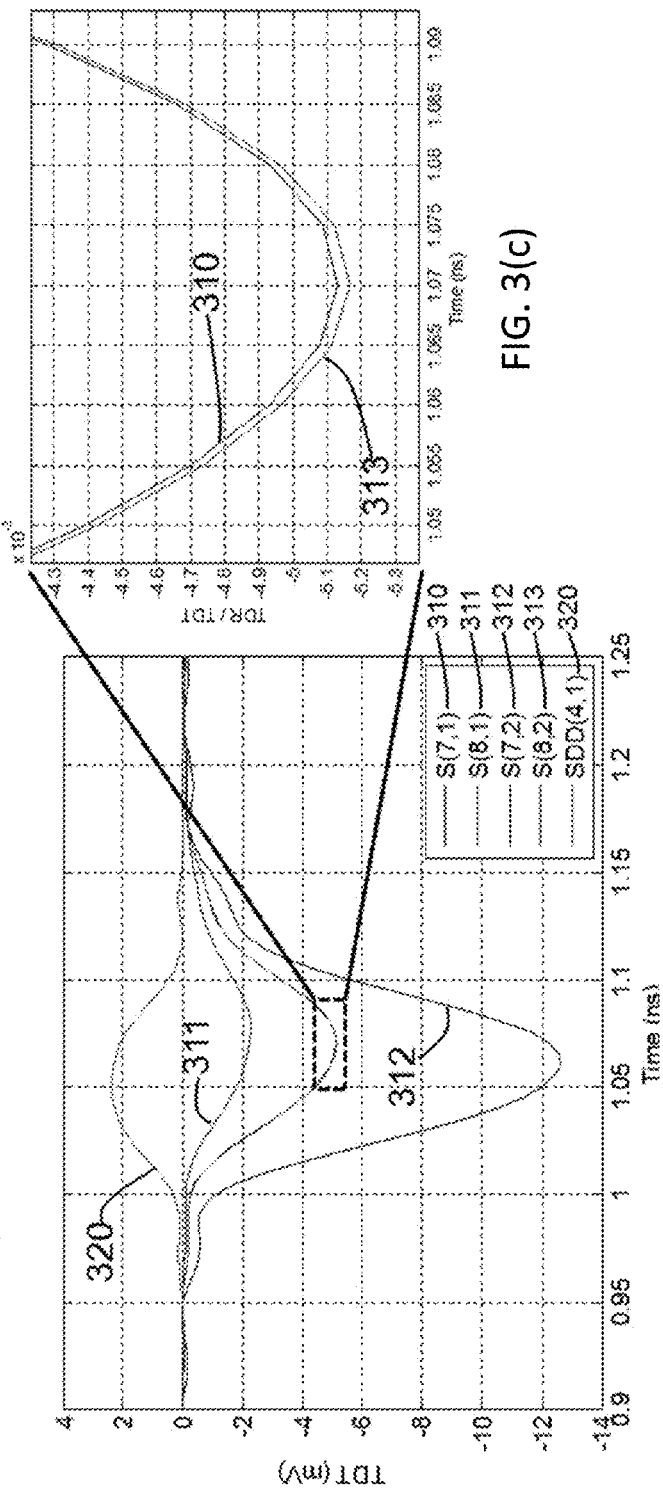
FIG. 3(a)
FIG. 3(b)
FIG. 3(c)

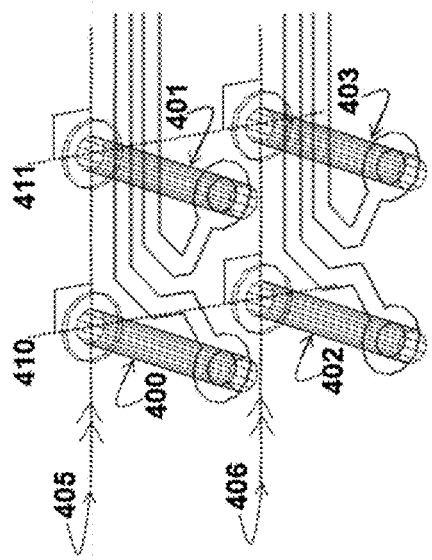
FIG. 4(a)
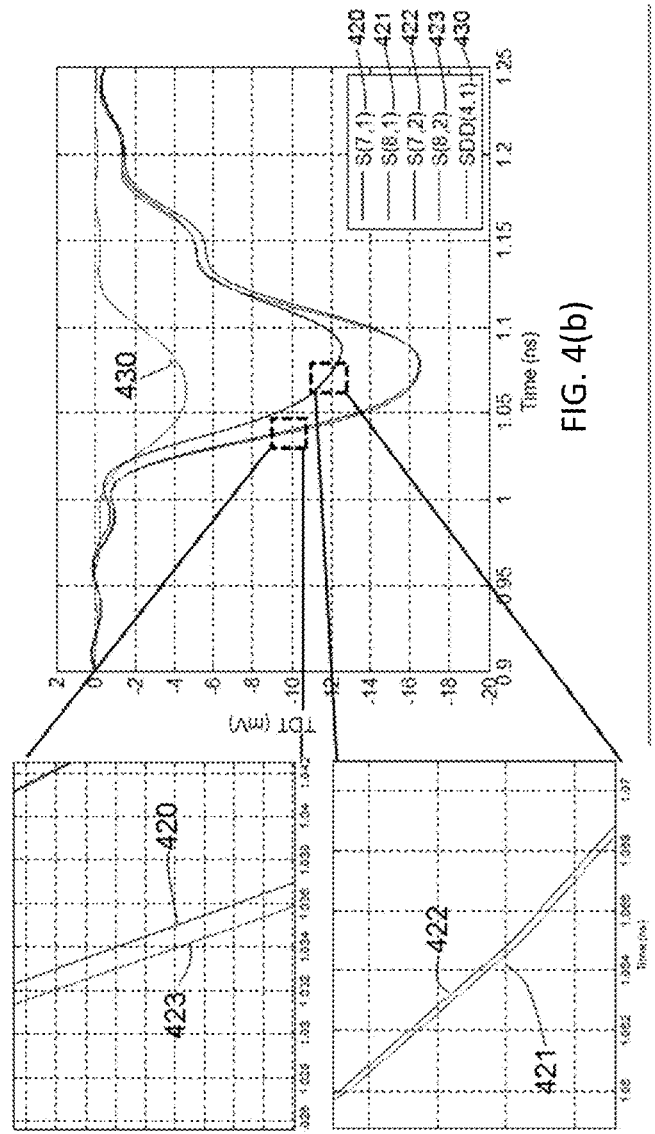
FIG. 4(b)
FIG. 4(c)
FIG. 4(d)

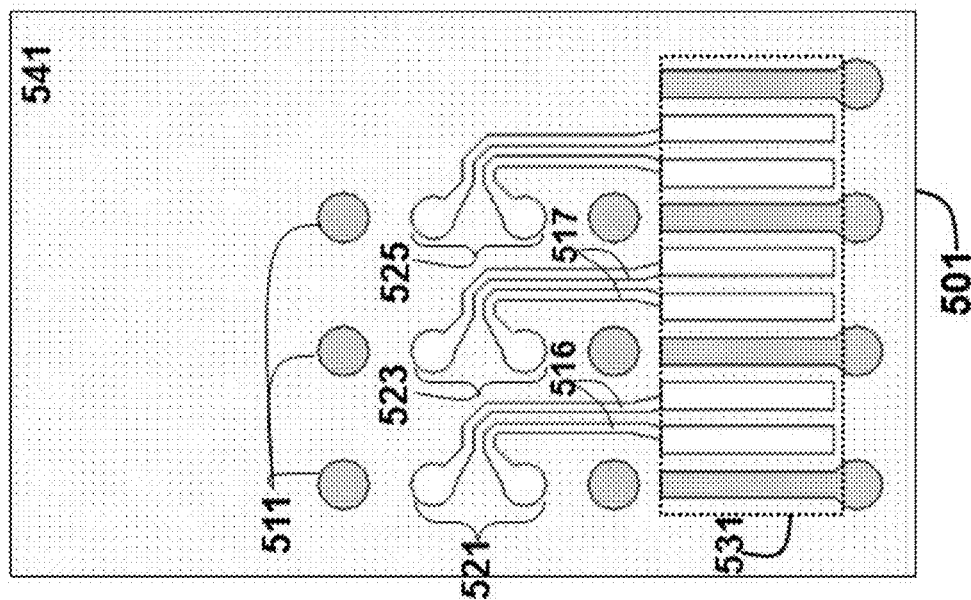
FIG. 5(b)
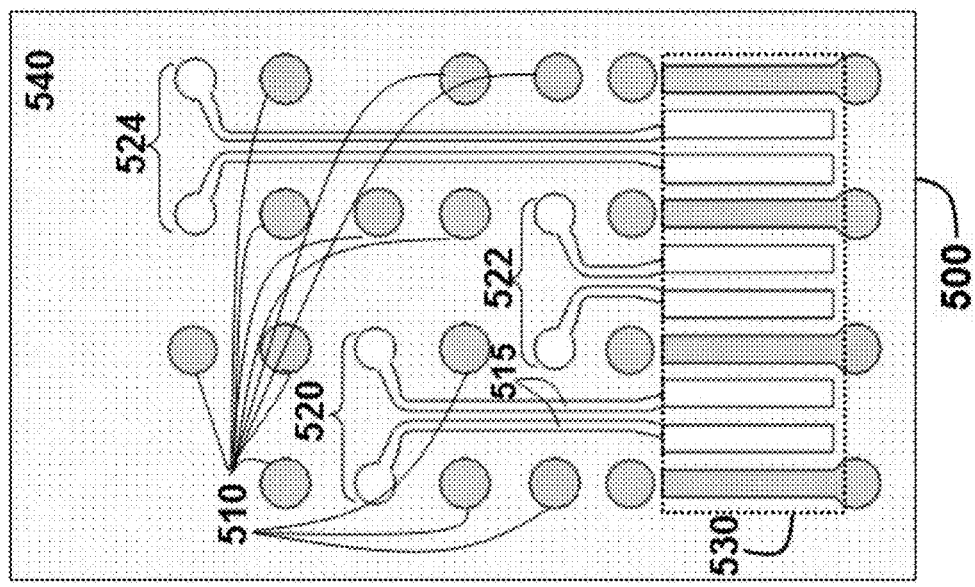
FIG. 5(a)

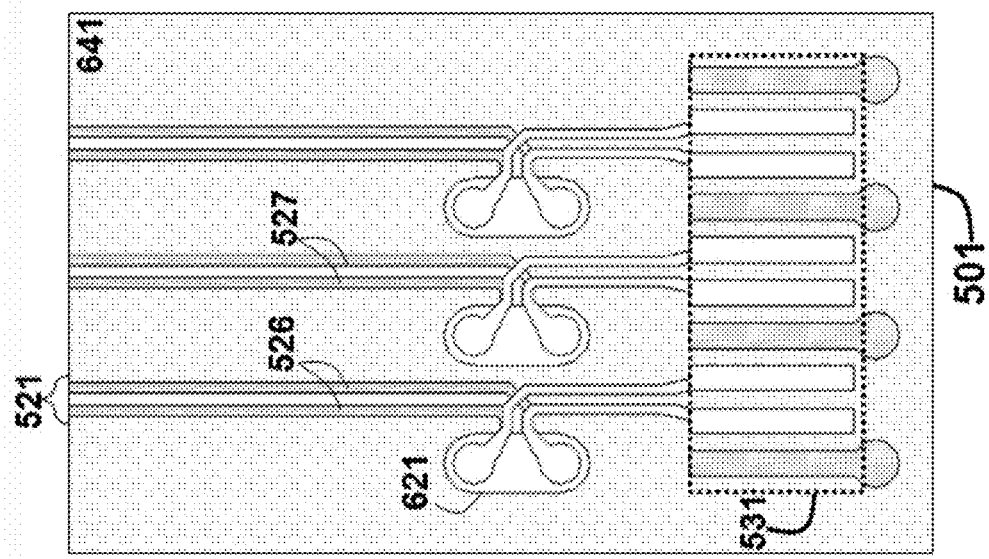
FIG. 6(b)
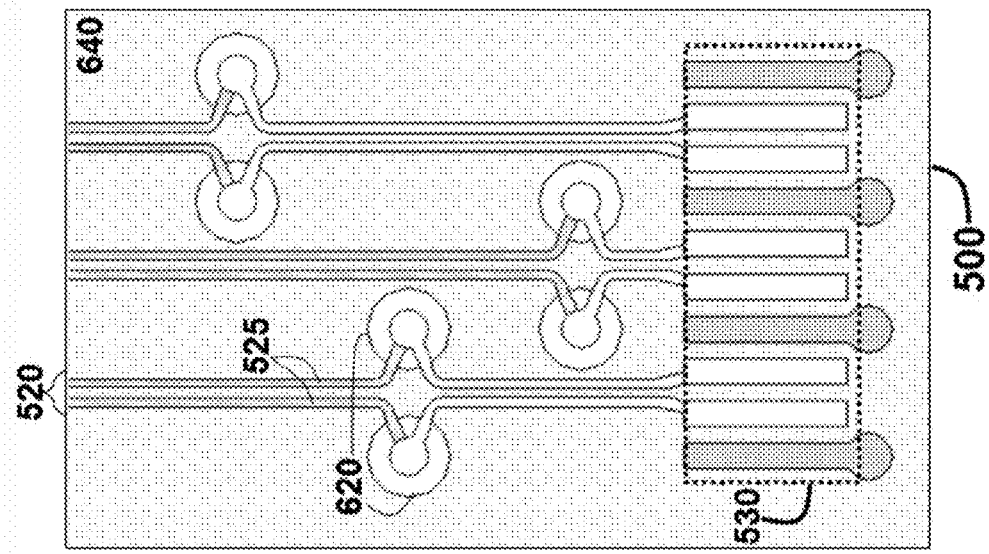
FIG. 6(a)

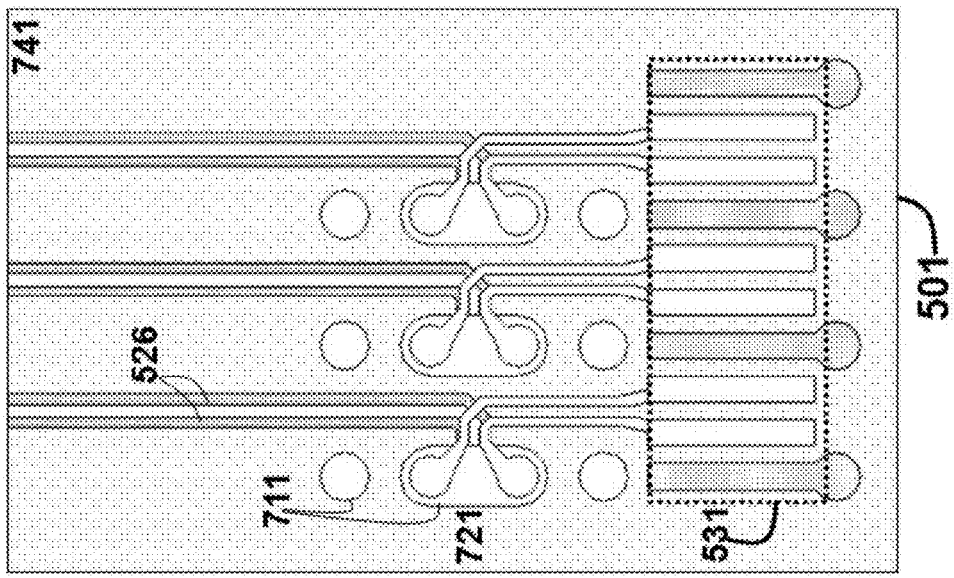
FIG. 7(b)
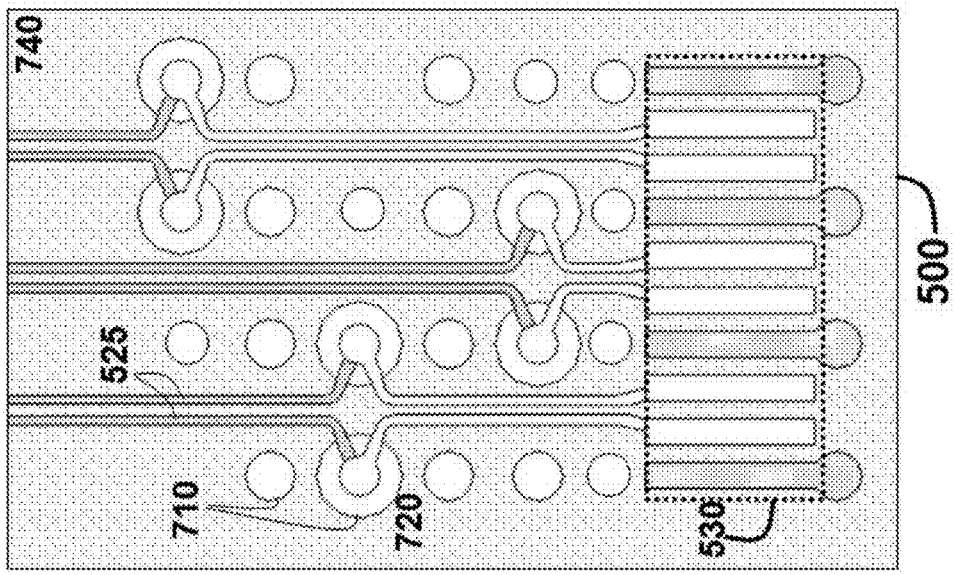
FIG. 7(a)

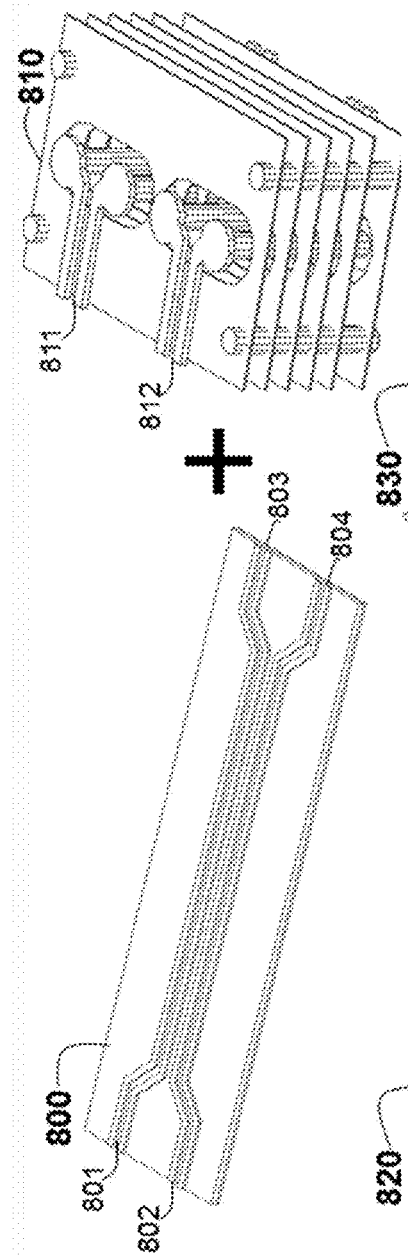
FIG. 8(a)
FIG. 8(b)
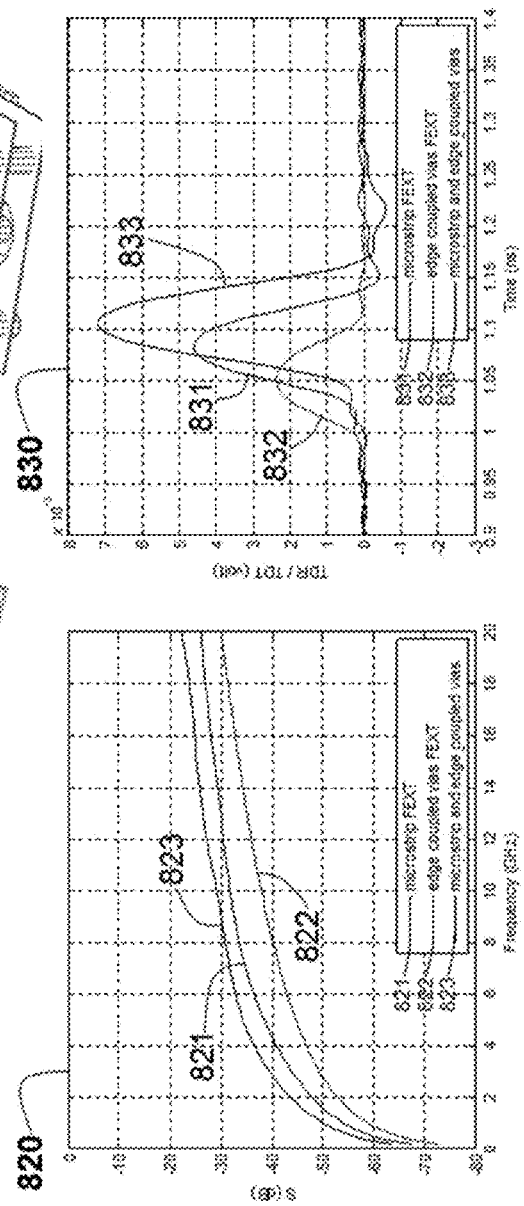
FIG. 8(c)
FIG. 8(d)

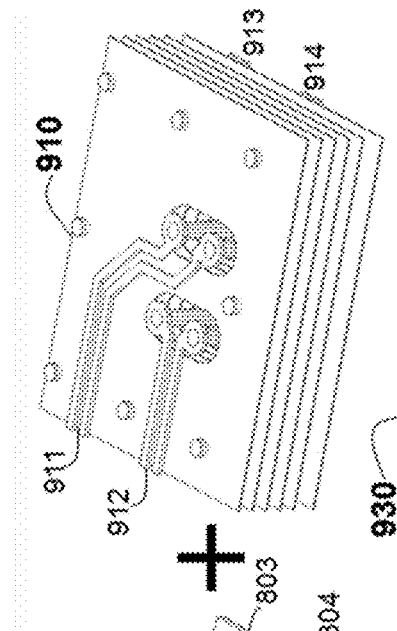
FIG. 9(b)
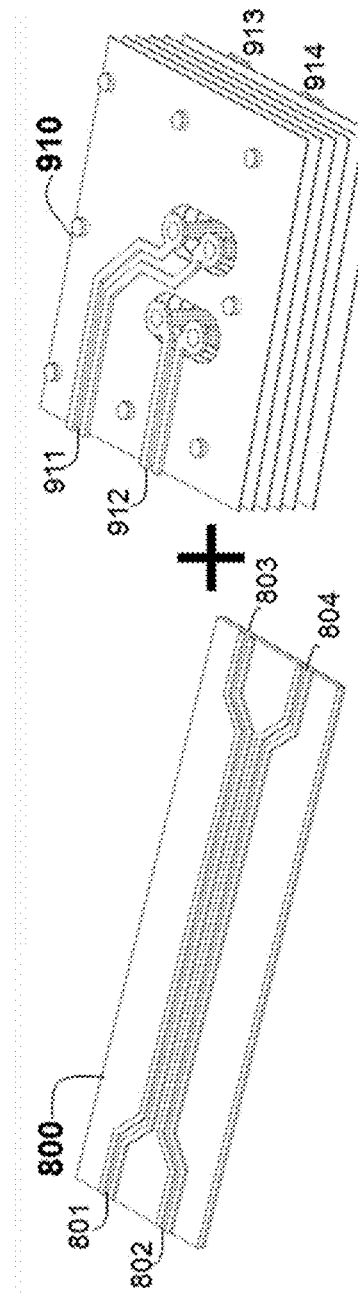
FIG. 9(a)
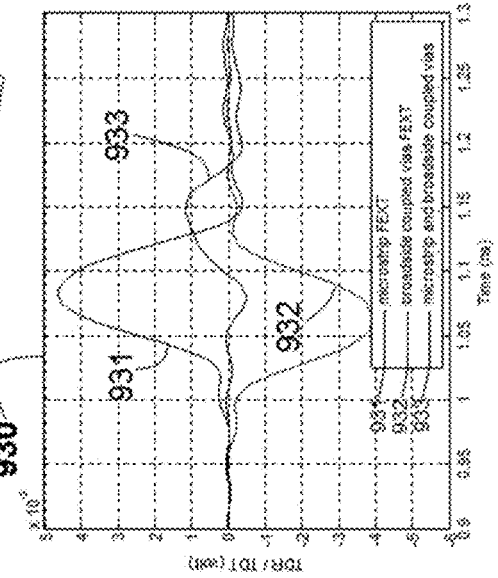
FIG. 9(d)
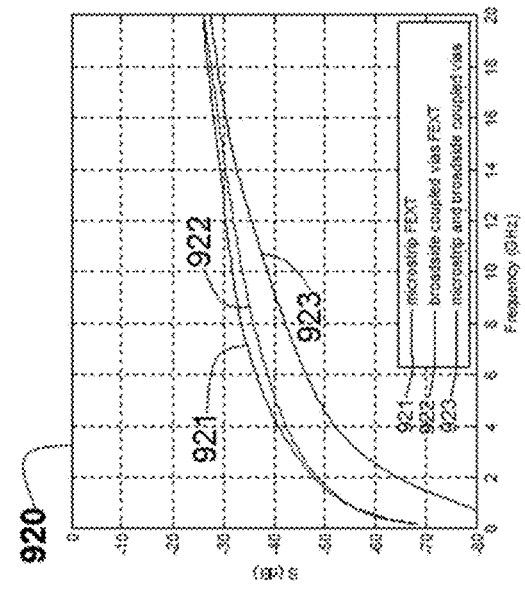
FIG. 9(c)

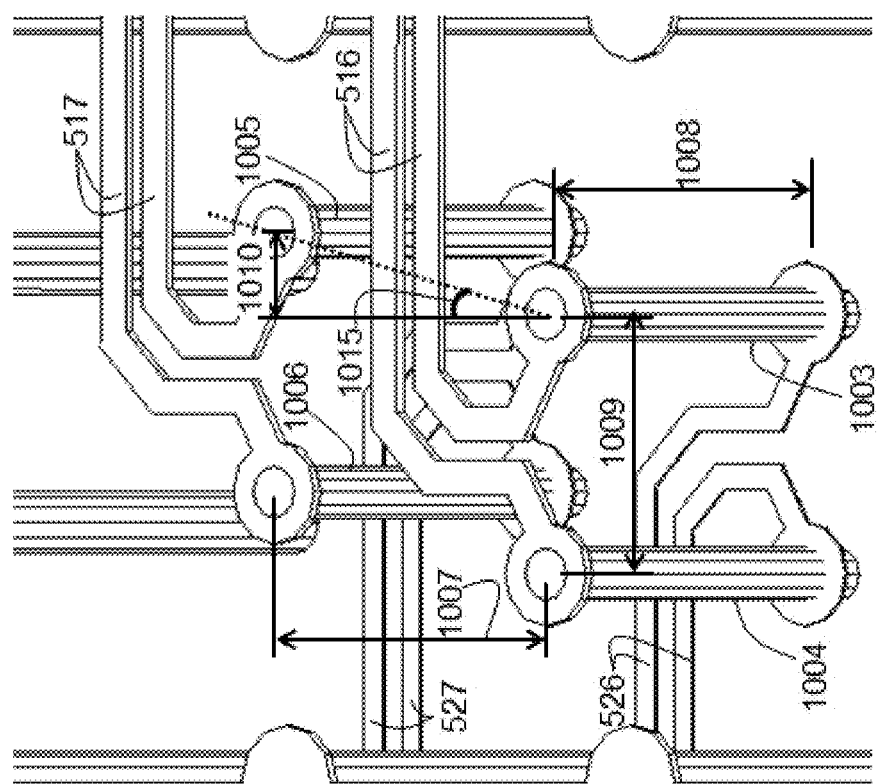
FIG. 10

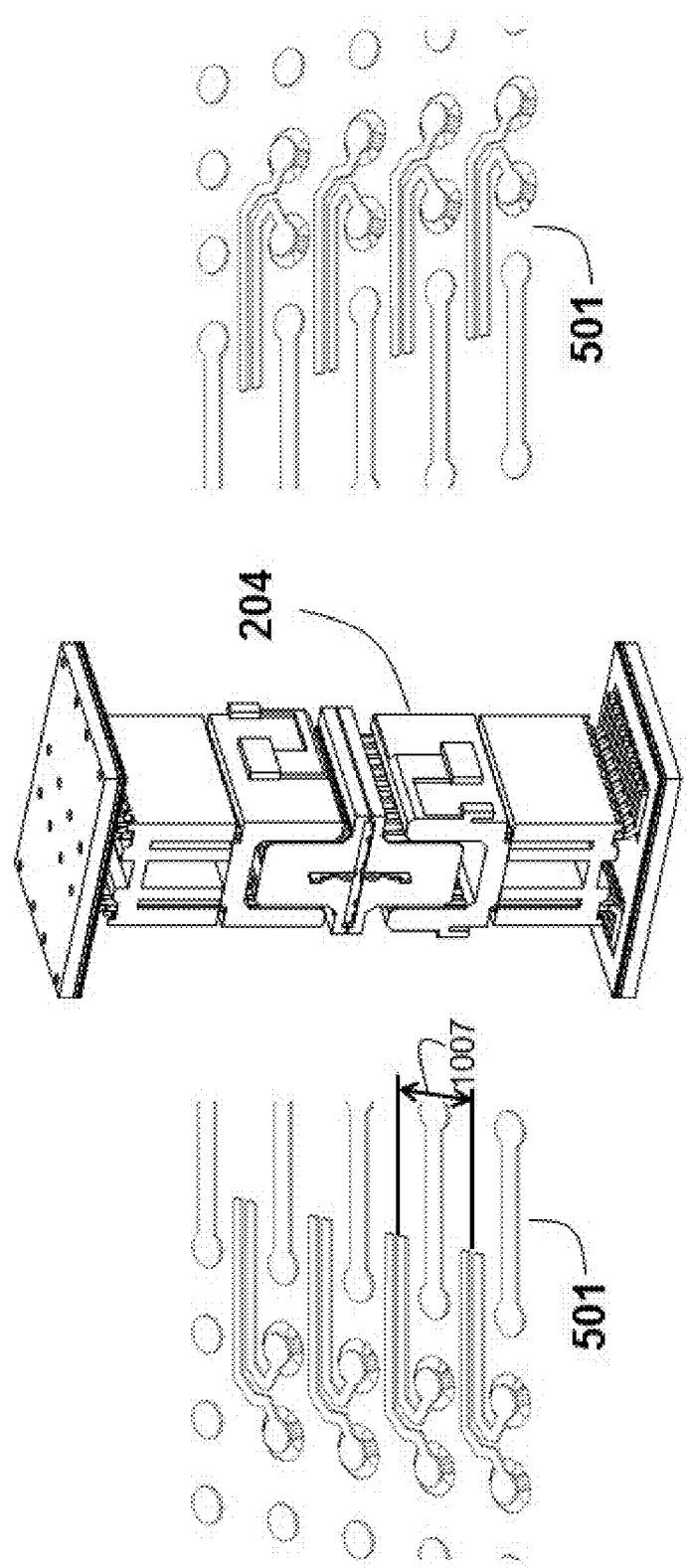
FIG. 11

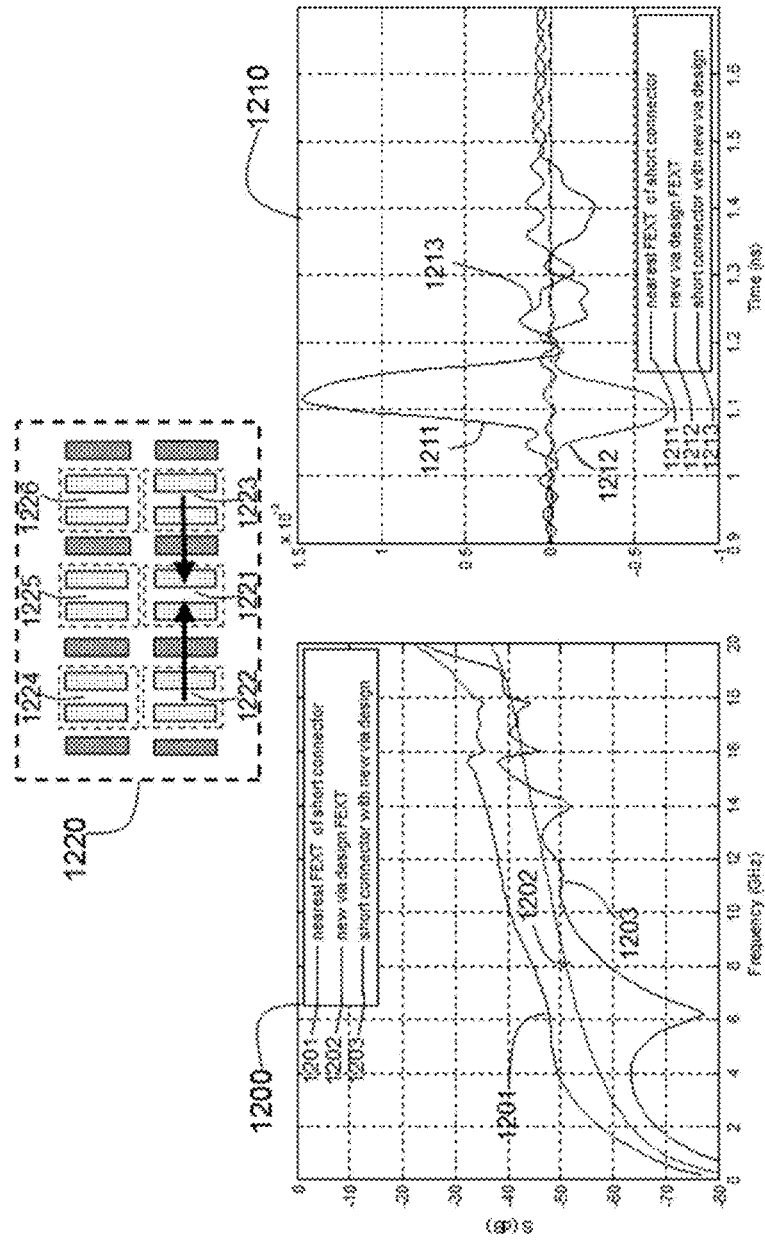

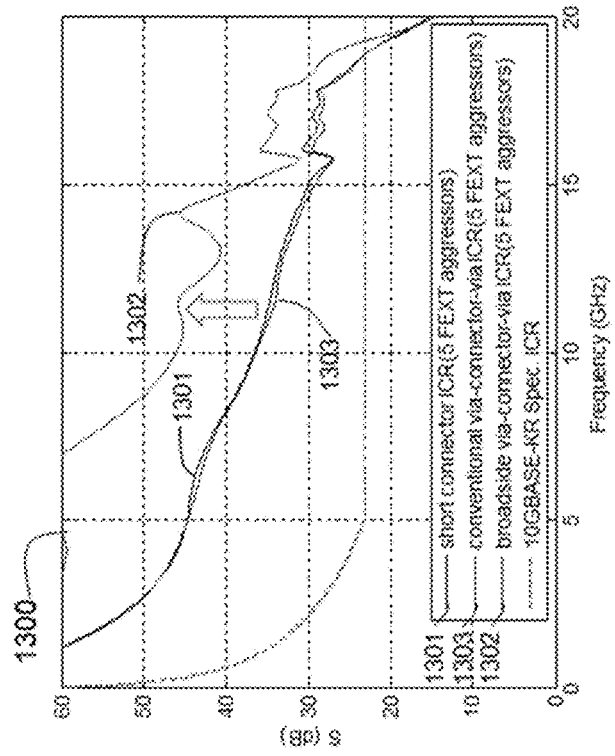
FIG. 13(c)
FIG. 13(b)
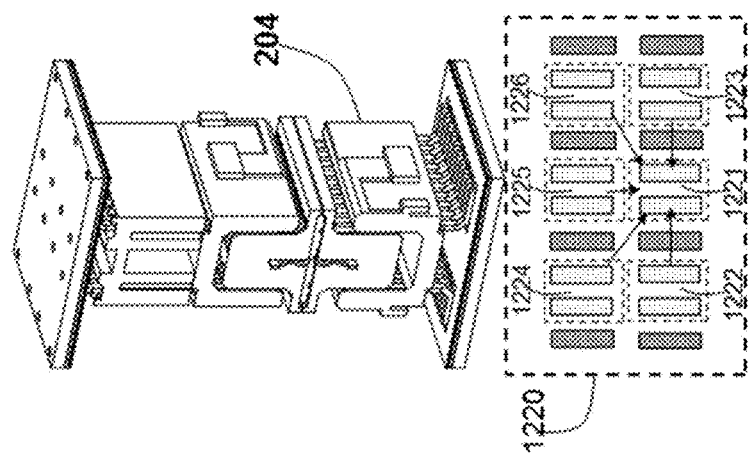
FIG. 13(a)

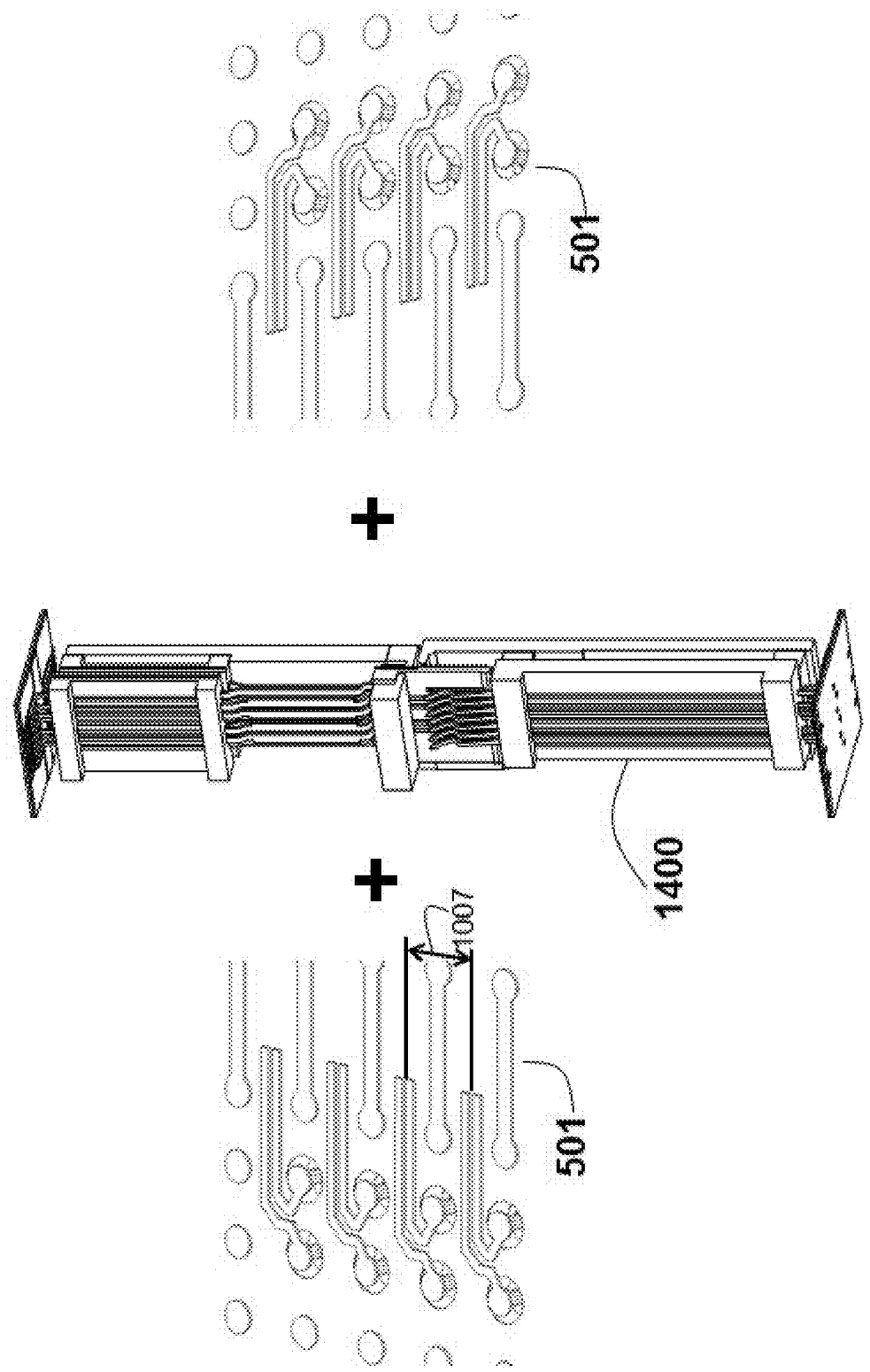
FIG. 14

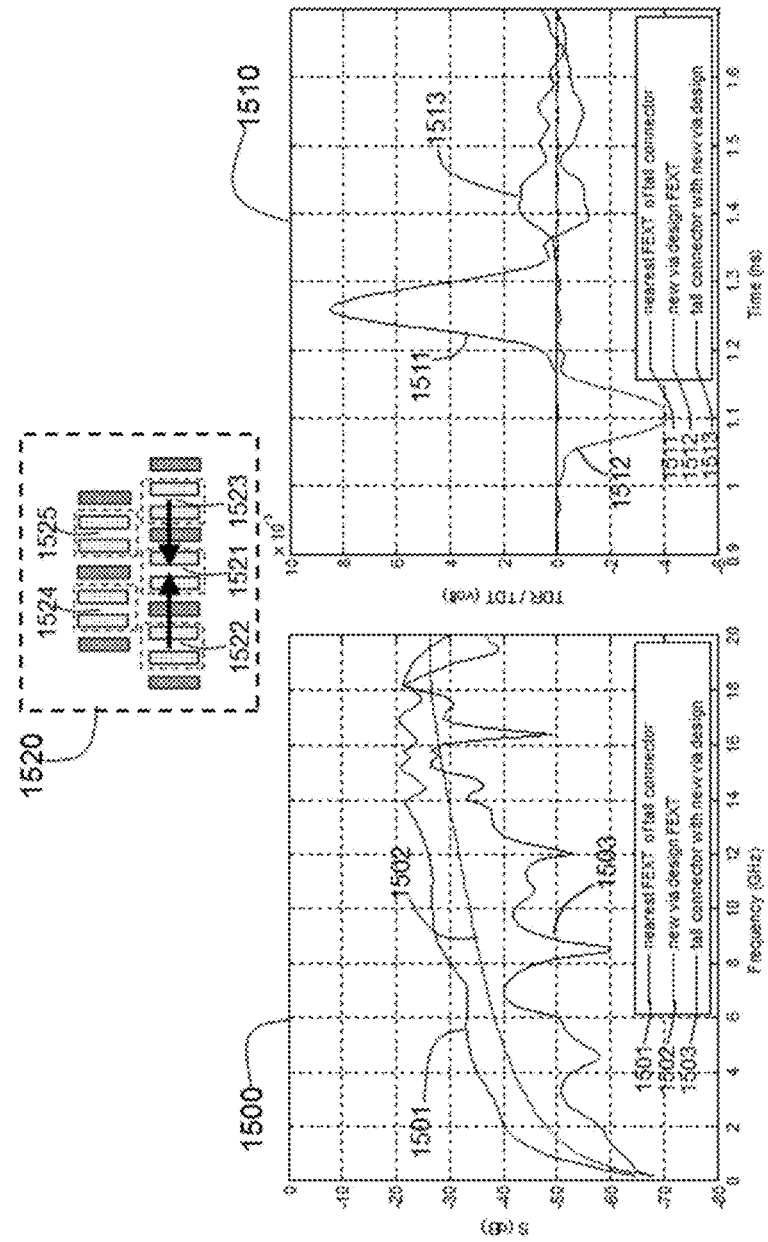

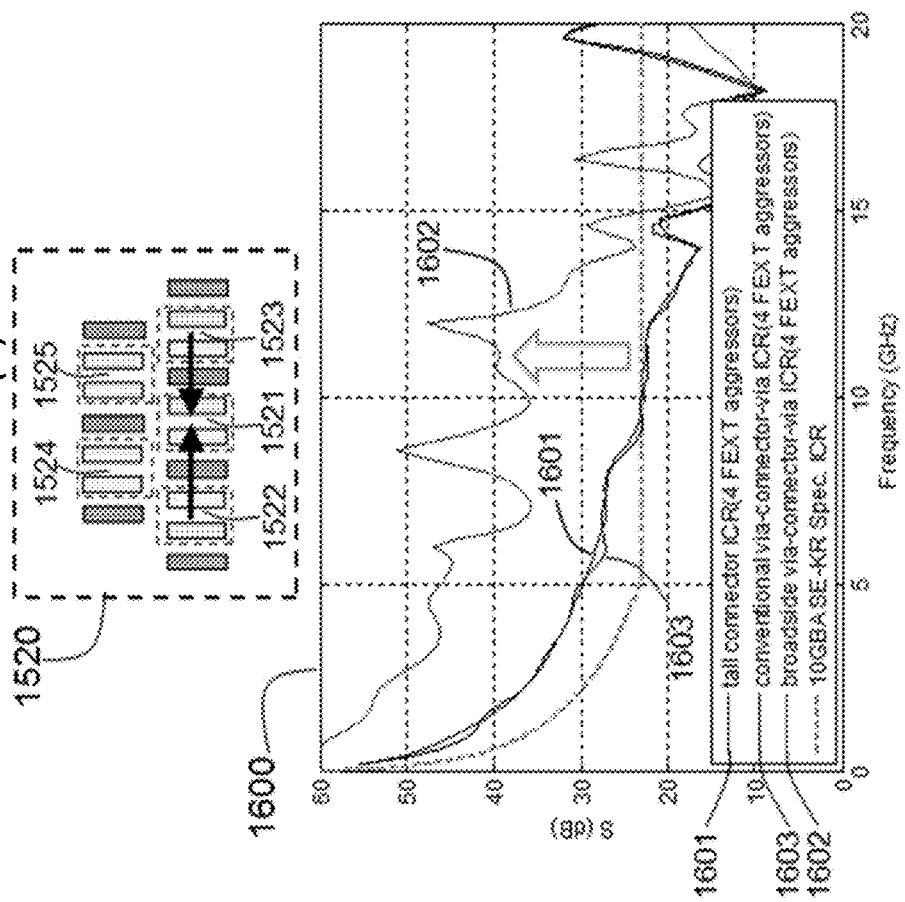

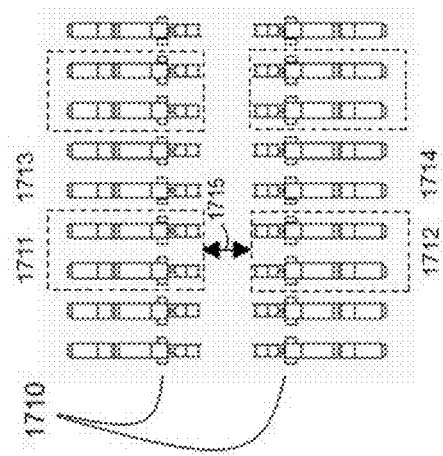
FIG. 17(b)
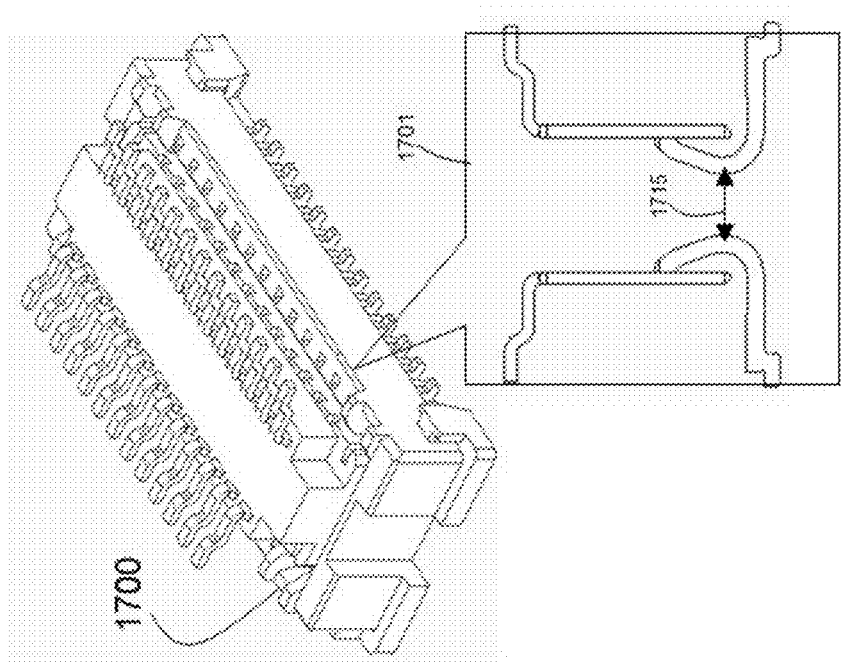
FIG. 17(a)

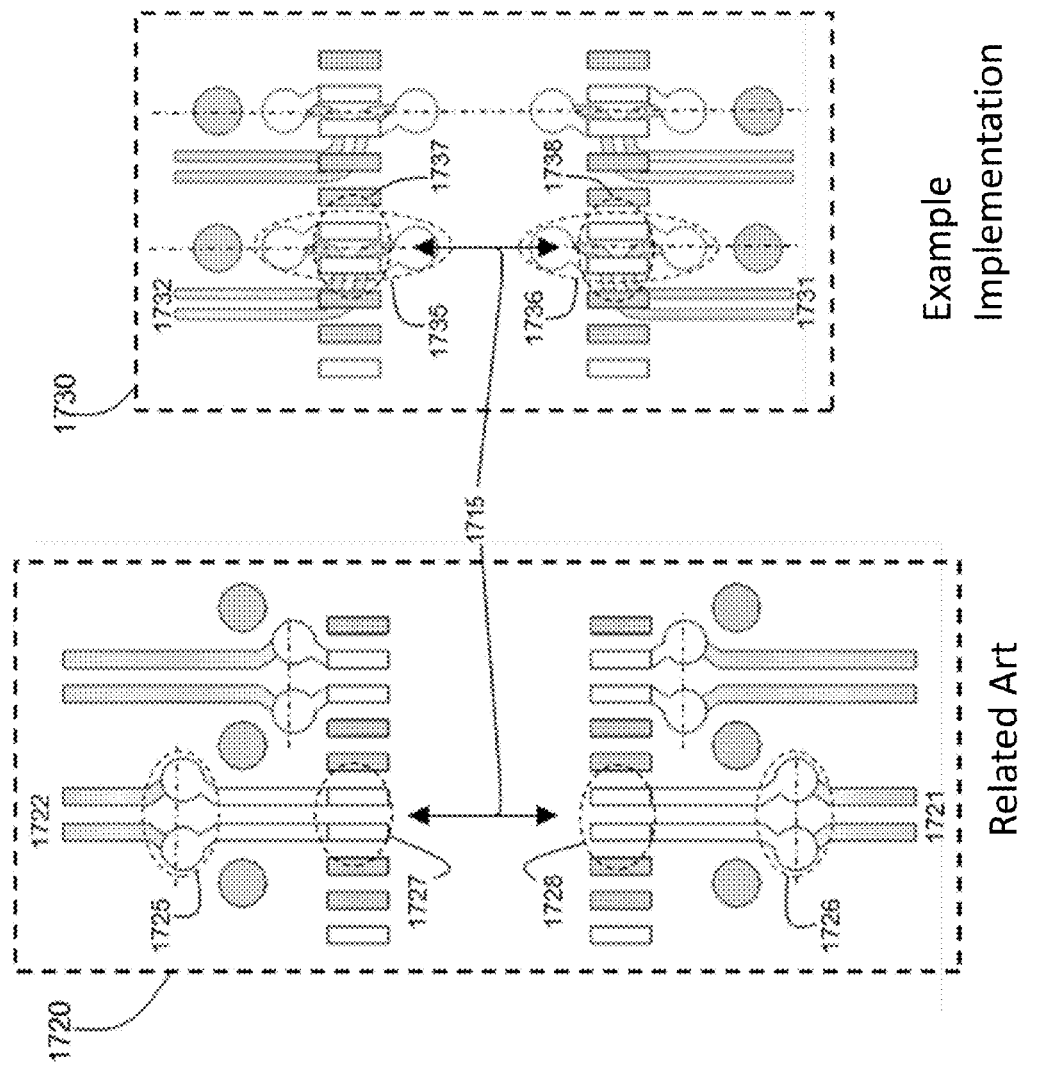
Example Implementation
FIG. 17(d)
Related Art
FIG. 17(c)

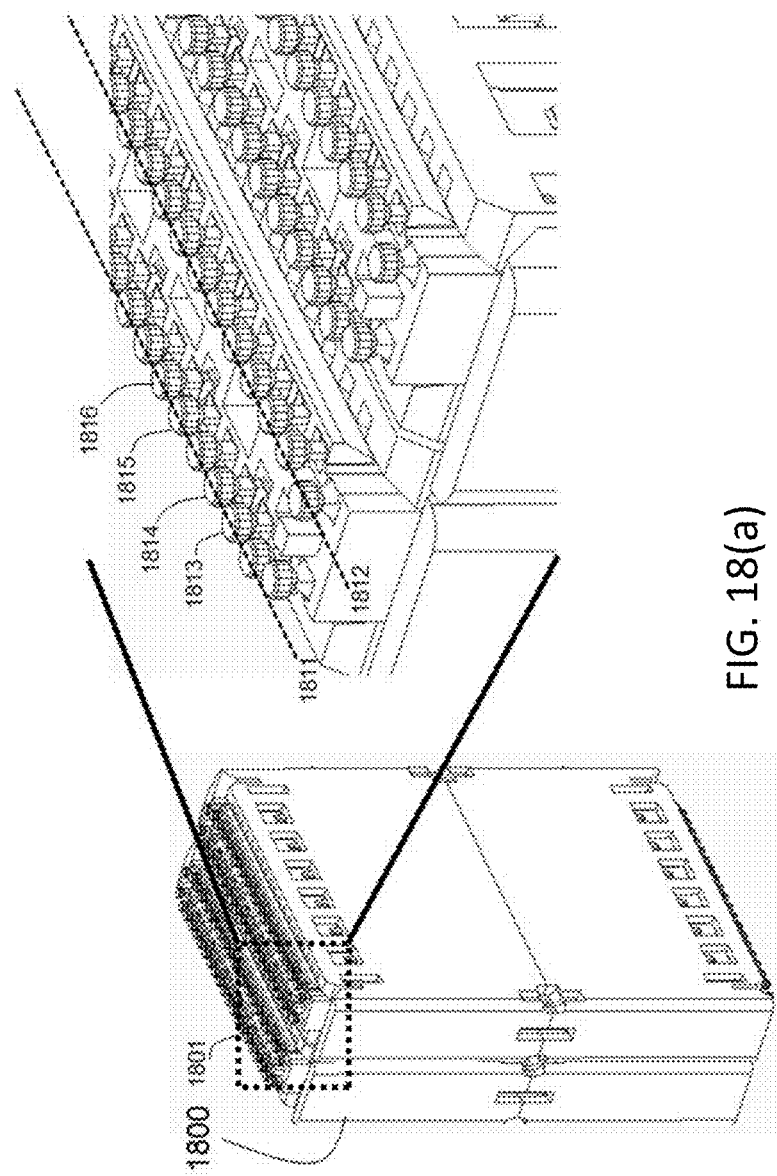
FIG. 18(a)

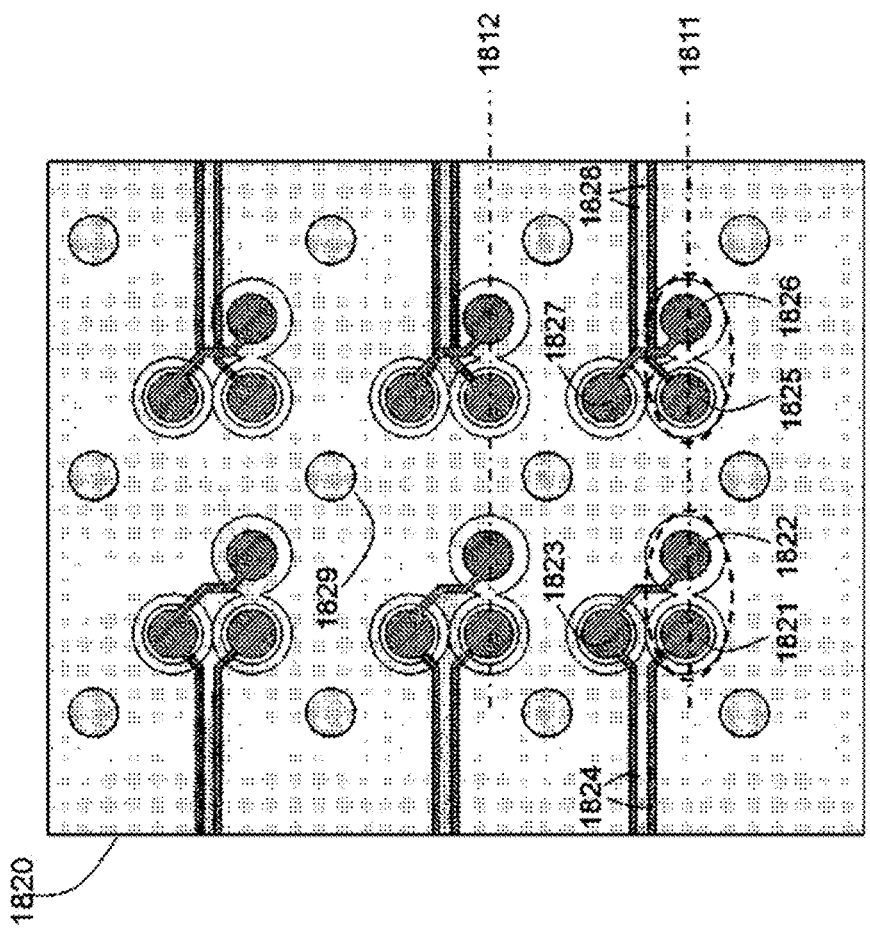
FIG. 18(b)

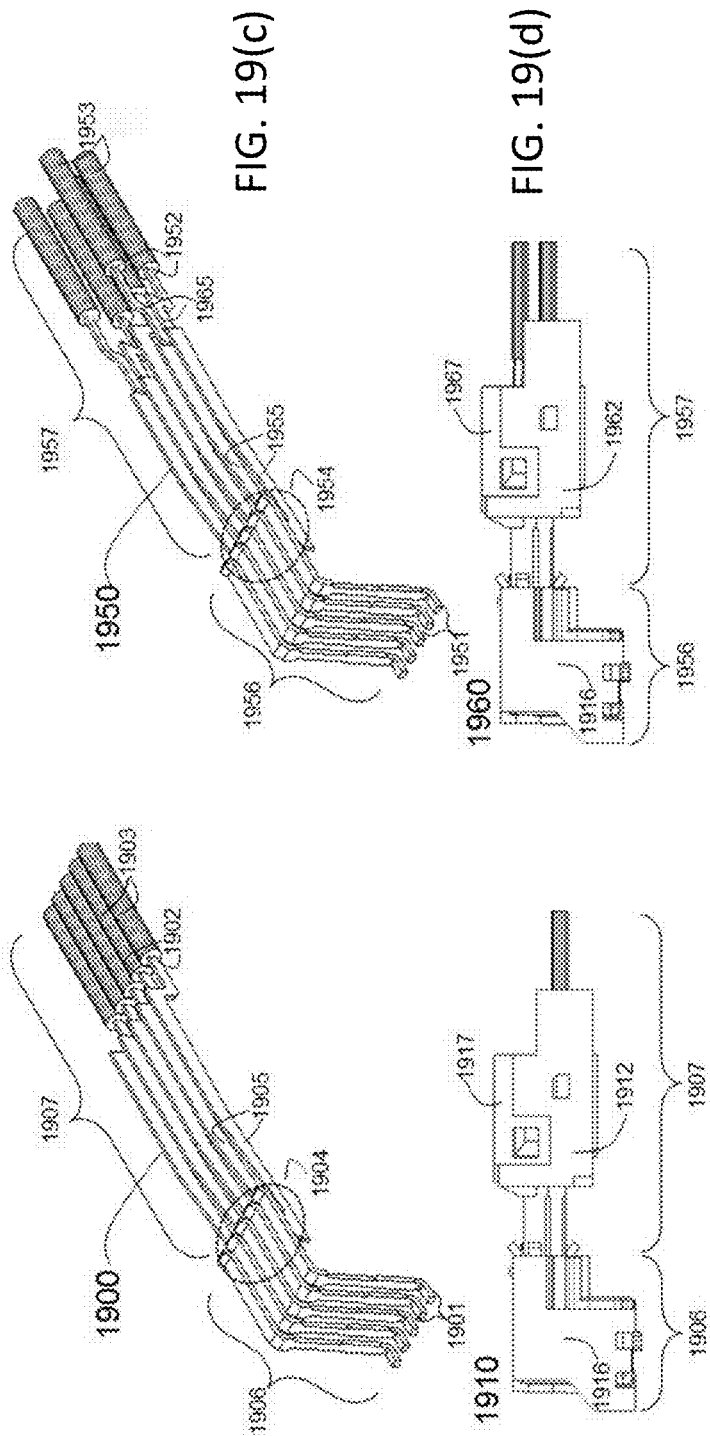

METHOD AND APPARATUS FOR REDUCING FAR-END CROSSTALK IN ELECTRICAL CONNECTORS

CROSS REFERENCE TO RELATED APPLICATIONS

This application claims priority to U.S. provisional patent application No. 62/009,801 filed on Jun. 9, 2014, which is incorporated herein by reference in its entirety for all purposes.

BACKGROUND

Field

Systems, apparatuses, methods and example implementations described herein are generally directed to systems for reducing Far-End Crosstalk (FEXT) and, more particularly, to the reduction of FEXT in electrical connectors and plated through holes that are transmitting differential signals.

Related Art

As demand for higher bandwidth continues to grow in telecommunication industry, each device may require more computational power and routing capability. The data rate for each signal channel continues to increase, as does signal density. As a result, unwanted noise, or electromagnetic coupling occurring between neighbor channels significantly increases. For high-speed applicability and reduction in noise compared to single-ended data lines, differential signaling has become a preferred related art method for data transmission.

For the differential victim pair being considered, unwanted electromagnetic coupling (e.g., crosstalk) from neighboring aggressor pairs occurs throughout the data transmission path when at least one of these neighboring pairs is active. When an aggressor's transmitter and victim's receiver are physically far away from each other (located at different chips, for example), crosstalk induced in the same direction as the signal is called far-end crosstalk, or FEXT.

In general, the chip package, connector, and vias are dominant sources of FEXT, due to the close proximity of signal lines. Several attempts at reducing FEXT in the via field on the Printed Circuit Boards (PCBs) have been made by increasing spacing, adding ground between differential pairs, tightening coupling within a differential pair or balancing inductive and capacitive coupling coefficients. In an example related art implementation, two adjacent pairs of vias are made symmetric and equi-distanced to reduce the FEXT of the via itself.

However, such related attempts have increased consumption of allocated real estate, imposed difficulty in design and implementation, and been relatively insufficient in reducing cumulative total FEXT, particularly in higher frequency systems. Therefore, there is a need for additional ways to reduce total FEXT.

SUMMARY

In example implementations, one method to reduce FEXT is by balancing capacitive and inductive coupling. The concept that FEXT is proportional to the difference between capacitive and inductive couplings is valid at least for 2-line lossless systems at low frequencies. FEXT also depends on impedance mismatch and resistive and conductive coupling. In a multi-line system or at high frequencies, modal decomposition, instead of RLGC coupling (where R is resistive, L is inductive, G is conductive and C is capacitive), may be used to explain FEXT.

The present disclosure and examples described herein are directed to reducing total differential FEXT (not single-ended FEXT) in a system, based on the concept that FEXT (or differential FEXT) is cumulative. The present disclosure differs from balancing capacitive and inductive coupling as in the related art in that the present disclosure applies to multi-line lossy systems at high frequencies by manipulating the four individual single-ended terms in differential FEXT coupling to give either positive or negative polarity.

For a system of two coupled differential pairs with the first pair having ports 1 and 2 (aggregately as differential port 1) as inputs and ports 5 and 6 (aggregately as differential port 3) as outputs and the second pair having ports 3 and 4 (aggregately as differential port 2) as inputs and ports 7 and 8 (aggregately as differential port 4) as outputs, the differential FEXT from differential port 1 to differential port 4, SDD41, is given by SDD41=(S71+S82−S72−S81)/2, where Sij represents the single-ended scattering parameters (or S parameters) from Port j to Port i. So, if S71+S82 is greater than S81+S72, then there is a positive-polarity differential FEXT, and if S81+S72 is greater than S71+S82, then there is a negative-polarity differential FEXT. It is irrelevant whether each single-ended term, S71, S81, S72 or S82 is more inductively or capacitively coupled at the low frequency sense.

By arranging the structure geometry and/or location, S71+S82 can be made either greater than or less than S81+S72, in which may cause positive- or negative-polarity SDD41. One example is that a broadside-coupled structure will give a negative-polarity differential FEXT and an edge-coupled structure will give a positive-polarity differential FEXT. Thus, if a system involves both broadside-coupled and edge-coupled structures, the total cumulative differential FEXT will tend to be smaller. This FEXT polarity optimization technique can be applied to a chip package, a connector, a printed circuit board (PCB), or any differential system that experiences FEXT.

In example implementations, any electrical system involving electrical components having an opposite polarity can be utilized to reduce FEXT. Example implementations described herein can be applied to applications, such as personal computers, servers, switches and routers for which high speed differential signaling is used as a method for data transmission.

In an example implementation, a first electrical component having a first polarity is connected to a second electrical component having a second polarity, wherein the second polarity is opposite to the first polarity. By utilizing the opposing polarities across the components, the cumulative differential FEXT across the electrical system can be reduced. In example implementations of the present disclosure, there is a via or PCB component connected to a connector component. However, the implementation of opposite polarity components can be implemented in any electrical system involving multiple components, such as via/PCB component to package, a first portion of a connector mechanically connected to a second portion of a connector (e.g., two piece connector, three piece connector), and so forth.

In one aspect of the present disclosure, the idea is implemented in the PCB via design by taking account of the differential FEXT induced at an adjacent source, such as an electrical connector. With the existing via design technology, many ground vias are placed between differential pairs of vias as shielding, however, residual differential FEXT still accumulates with FEXT of the connector. In example implementations, FEXT cancellation is achieved by understanding that broadside coupled differential pairs give negative polarity of differential FEXT, whereas edge-coupled differential pairs give positive polarity. This permits PCB designers to choose a via design in their system by understanding differential FEXT of the connector to achieve differential FEXT cancellation.

Examples of additional attributes of the implementations of the present disclosure may include, but are not limited to, space saving, ease of PCB trace routing and stable power distribution through the connector. Placing too many ground vias and signal vias that are spaced out will result in a large consumption of PCB real estate by the via field, a limited space for routing traces to escape vias, and a poor power distribution at the connector due to densely populated antipads on the power plane. With the example implementations describe herein, a fewer number of ground vias can be utilized to achieve sufficient FEXT at vias to offset FEXT from the connector, which is in many cases much larger than the vias.

It is to be understood that both the foregoing and the following descriptions are exemplary and explanatory only and are not intended to limit the claimed invention or application thereof in any manner whatsoever.

BRIEF DESCRIPTION OF THE DRAWINGS

The accompanying drawings, which are incorporated in and constitute a part of this specification exemplify the embodiments of the present invention and, together with the description, serve to explain and illustrate principles of the inventive technique. Specifically:

FIG. 1 illustrates accumulation of FEXT by a victim throughout a communication channel with and without optimization of FEXT polarity of vias used to route connector signals into PCB, in accordance with an example implementation.

FIG. 2 illustrates a 3D image of channel schematic shown in FIG. 1, in accordance with an example implementation.

FIG. 3(a) illustrates an example of edge-coupled vias, in accordance with an example implementation.

FIGS. 3(b) and 3(c) illustrate example graphs for the edge-coupled vias of FIG. 3(a), in accordance with an example implementation.

FIG. 4(a) illustrates an example of broad-side coupled vias, in accordance with an example implementation.

FIGS. 4(b) to 4(d) illustrate example graphs for the broad-side coupled vias, in accordance with an example implementation.

FIGS. 5(a) and 5(b) illustrate a top view of PCB showing conventional via routing and novel via routing layout in accordance with an example implementation.

FIGS. 6(a) and 6(b) illustrate antipads on a ground layer for both conventional and novel via routing, in accordance with an example implementation.

FIGS. 7(a) and 7(b) illustrate antipad population on the power plane in the via-field, in accordance with an example implementation.

FIGS. 8(a) to 8(d) illustrate an example of FEXT accumulation by positive polarity FEXT of two differential microstrip pairs followed by edge-coupled vias.

FIGS. 9(a) to 9(d) illustrate an example of positive FEXT of two differential microstrip pairs being canceled by negative polarity FEXT of broad-side coupled vias, in accordance with an example implementation.

FIG. 10 illustrates examples of variables having an influence on magnitude and polarity of via FEXT, in accordance with an example implementation.

FIG. 11 illustrates an example implementation as applied to high speed, short stacking height, surface mount (SMT) type connector.

FIG. 12(a) illustrates a PCB pad layout in accordance with an example implementation.

FIGS. 12(b) and 12(c) illustrate graphs of differential FEXT in frequency domain and time domain for connector-only, via-only and via-connector-via cascaded models, in accordance with an example implementation.

FIG. 13(a) illustrates pairs in accordance with an example implementation.

FIG. 13(b) illustrates the SMT type connector in accordance with an example implementation.

FIG. 13(c) illustrates a graph of insertion loss-to-crosstalk ratio (ICR) of connector with and without via models cascaded, in accordance with an example implementation.

FIG. 14 illustrates an example implementation as applied to high speed, tall stacking height, surface mount (SMT) type connector.

FIG. 15(a) illustrates pairs in accordance with an example implementation.

FIGS. 15(b) and 15(c) illustrate differential FEXT in frequency domain and time domain for connector-only, via-only and via-connector-via cascaded models, in accordance with an example implementation.

FIG. 16(a) illustrates pairs in accordance with an example implementation.

FIG. 16(b) illustrates a graph of insertion loss-to-crosstalk ratio (ICR) of connector with and without via models cascaded, in accordance with an example implementation.

FIGS. 17(a) to 17(d) illustrate an example implementation as applied to an electrical connector having negative polarity FEXT and via design having positive FEXT.

FIGS. 18(a) and 18(b) illustrate an example implementation as applied to a BGA connector.

FIGS. 19(a) to 19(b) illustrate related art configurations and FIGS. 19(c) to 19(d) illustrate example implementations as applied to an electrical connector.

DETAILED DESCRIPTION

The following detailed description provides further details of the figures and example implementations of the present application. Reference numerals and descriptions of redundant elements between figures are omitted for clarity. Terms used throughout the description are provided as examples and are not intended to be limiting. For example, the use of the term "FEXT cancellation" may involve some reduction or substantial reduction of FEXT, depending on the implementation of one of ordinary skill in the art practicing implementations of the present application.

FIG. 1 illustrates accumulation of FEXT by a victim throughout a communication channel with and without optimization of FEXT polarity of vias used to route connector signals into PCB, in accordance with an example implementation. Unless otherwise stated, FEXT in this document will signify 'differential FEXT.' Differential pair 100 serves as an active channel, or an aggressor, with input 101 and output 102. Schematic 140 illustrates an example of components (PCB, via1, connector, via 2, PCB) inside a channel for the aggressor and victims. Channels 110, 120 and 130 are victim channels and each channel shows different case of FEXT accumulation. Specifically, victim channel 110, with input 111 and output 112, shows a related art FEXT accumulation. When signal 103 propagates through differential pair 100, FEXT 114 is observed at via1, 115 at the connector and 116 at the via2 in channel 110. Because the polarity of each FEXT component is positive, total crosstalk accrued at output 112 is shown as 117.

Victim channel 120, with input 121 and output 122, shows an example of FEXT cancellation by designing vias to produce opposite polarity as the connector. Specifically, via FEXT 124 and 126 are negative and connector FEXT 125, is positive. After summation at output 122, resulting FEXT is shown as 127.

Victim channel 130, with input 131 and output 132, shows another example of FEXT cancellation where via FEXT 134 and 136 are positive and connector FEXT 135 is negative. Summing at output 132 shows total FEXT 137 for channel 130.

FIG. 2 illustrates an example of channel schematic 140 shown in FIG. 1, in accordance with an example implementation. Multi-layer PCBs 200 and 201 are provided, wherein a surface mount type connector 204 is mounted near via fields 202 and 203. In the detailed cross section 205 of via fields 202 and 203, trace 207 is routed inside PCB as stripline and brought to the surface to link with a connector using via 206.

FIG. 3(a) illustrates an example of edge-coupled vias. Vias 300 and 301 illustrate a first differential pair and vias 302 and 303 illustrate a second differential pair placed side by side with the first differential pair. Edge-coupled vias will be referred to as where a straight line 305 drawn through the center of vias 300 and 301 overlaps with a straight line 306 drawn through the center of vias 302 and 303. This edge-coupled configuration between first differential pair vias and second differential pair vias yields positive FEXT.

The graph of FIG. 3(b) represents time-domain crosstalk showing differential FEXT 320 and corresponding single ended terms 310 (crosstalk from via 300 to 302), 311 (crosstalk from via 300 to 303), 312 (crosstalk from via 301 to 302) and 313 (crosstalk from via 301 to 303). Note that single ended terms 310 and 313 are substantially similar due to symmetry, and thus the lines substantially overlap as illustrated in FIG. 3(b) and in the close up view of FIG. 3(c). Visualizing FEXT as (S71+S82−S72−S81)/2, while assigning port 1 as input and 5 as output to via 300, port 2 as input and 6 as output to via 301, port 3 as input and 7 as output to via 302, port 4 as input and 8 as output to via 303, yields a positive FEXT value as illustrated at 320. Without loss of generality, the time-domain crosstalk in FIG. 3(b) and all subsequent graphs has been computed with a step input of 1 volt swing and 50 ps (20% to 80%) rise time injected into each input port.

FIG. 4(a) illustrates an example of broadside coupled vias, in accordance with an example implementation. Vias 400 and 401 illustrates a first differential pair and vias 402 and 403 illustrates a second differential pair placed in a broad-side configuration with respect to first differential pair. Broadside vias will be referred to as where a straight line 405 drawn through the center of vias 400 and 401, is in parallel with a straight line 406 drawn through the center of vias 402 and 403, and wherein a straight line 410 drawn through via 400 of the first differential pair and via 402 of the second differential pair and a straight line 411 drawn through via 401 of the first differential pair and via 403 of the second differential pair, are perpendicular to straight lines 405 and 406. When parallel lines 405 and 406 are slightly off angled from being perpendicular to straight lines 410 and 411, the subsequent configuration will be referred to as broadside with an offset. This broadside-coupled structure between first differential pair vias and second differential pair vias yields negative FEXT.

The graph of FIG. 4(b) represents time-domain crosstalk showing differential FEXT 430 and corresponding single ended terms 420 (crosstalk from via 400 to 402), 421 (crosstalk from via 400 to 403), 422 (crosstalk from via 401 to 402) and 423 (crosstalk from via 401 to 403). Note that 420 and 423 are substantially similar due to symmetry, and 421 and 422 are also substantially similar due to symmetry, and thus the graph line of 420 substantially overlaps that of 423, and 421 substantially overlaps that of 422, respectively, as illustrated in the close up views of FIGS. 4(c) and 4(d). Visualizing FEXT as (S71+S82−S72−S81)/2, while assigning port 1 as input and 5 as output to via 400, port 2 as input and 6 as output to via 401, port 3 as input and 7 as output to via 402, port 4 as input and 8 as output to via 403, yields a negative FEXT value as illustrated at 430. Its magnitude can be controlled by increasing or decreasing the difference between 420 and 421, and 422 and 423. One way to accomplish this is to either increase or decrease distance between first and second differential pair vias, where the distance is represented by lines 410 or 411 between crossing points of lines 405 and 406. A larger distance will yield a smaller difference, and therefore smaller negative differential FEXT, and a smaller distance will yield a larger difference, and therefore larger negative differential FEXT.

FIGS. 5(a) and 5(b) illustrates a top view of a PCB 540 and 541 showing related art via routing and via routing layout in an example implementation. Layout 500 of FIG. 5(a) shows related art via routing with ground vias 510 distribution for crosstalk shielding between neighbor differential pair vias and layout 501 shows an example implementation via routing with reduced ground vias 511. In layout 500 of FIG. 5(a), surface mount pads 530 are lined up near the bottom of the figure for a connector to be mounted. Differential traces such as 515 connect surface mount pads to the vias of differential pair 520 for routing into inner layers.

Ground via 510 is always present between or near two signal vias of neighbor differential pairs, such as between right signal via of differential pair 520 and left signal via of differential pair 522, or between right signal via of differential pair 522 and left signal via of differential pair 524. Pattern of layout, or cell, 500 of FIG. 5(a) is repeated throughout the number of pins on a connector and hence additional ground vias are required inside each cell. In layout 501 of FIG. 5(b), surface mount pads 531 are lined up near the bottom of the figure for a connector to be mounted. Note that connector pins in this layout will have an edge-coupling orientation because the pins will be aligned side by side just like the vias in FIG. 3. Differential traces such as 516 connect surface mount pads to the vias of differential pair 521 for routing into inner layers. All adjacent pair vias are in a broad-side configuration, to produce a negative polarity FEXT. Ground vias 511 are present to provide electrical connection between all ground layers of PCB 541 and to control half wave resonance of via fences used for inner stripline layers. Note that there is no ground via 511 present between signal vias of differential pairs 521 and 523, and differential pairs 523 and 525 to increase via coupling between adjacent pairs large enough to offset FEXT of connector in opposite polarity.

FIGS. 6(a) and 6(b) illustrate antipads on a ground layer for both conventional and novel via routing in accordance with an example implementation. Aspects visible in this layout in addition to FIGS. 5(a) and 5(b) includes striplines 525 and 526 of differential pairs 520 and 521 routing away from vias. Layer 640 of FIGS. 6(a) and 641 of FIG. 6(b) represent a ground layer and antipads 620 and 621 exist on all ground layers.

FIGS. 7(a) and 7(b) illustrates antipad distribution on power plane in a via-field, in accordance with an example implementation. Related art layout 500 of FIG. 7(a) shows densely populated antipads 710 on power plane 740 to prevent signal and ground vias from shorting with the power plane. The densely populated holes cause Direct Current (DC) crowding and may produce undesired heat that could have adverse effect on the PCB. Novel via layout 501 of FIG. 7(b) shows fewer antipads 711 on power plane 741 because the number of necessary ground vias is significantly less.

FIGS. 8(a) to 8(d) illustrate an example of FEXT accumulation by positive polarity FEXT of two differential microstrip pairs followed by edge-coupled vias. There are two differential pairs in a microstrip illustrated in FIG. 8(a) with input 801 and output 803 for a first differential pair, and input 802 and output 804 for a second differential pair as shown on PCB model 800. Via model 810 of FIG. 8(b) includes a first differential pair with input 811 and output 813, and a second differential pair with input 812 and output 814. Respective differential pair vias are placed side by side in an edge-coupled configuration. PCB model 800 data and via model 810 data are cascaded, where output 803 of PCB model 800 connects to input 811 of via model 810 and output 804 of PCB model 800 connects to input 812 of via model 810, to observe total accumulated FEXT. Graph 820 of FIG. 8(c) shows FEXT in the frequency domain of microstrip model 821, edge-coupled vias model 822 and cascaded microstrip-to-edge-coupled vias 823. Graph 830 of FIG. 8(d) shows FEXT in the time domain of microstrip model 831, edge-coupled via model 832 and cascaded-microstrip-to-edge-coupled vias 833. It can be observed in both cases that the cascaded model shows unreduced FEXT, as expected from the concept that FEXT accumulates and having both individual models producing positive value FEXT.

FIGS. 9(a) to 9(d) illustrate an example of positive FEXT of two differential microstrip pairs reduced when cascaded with negative polarity FEXT of broadside coupled vias, in accordance with an example implementation. The same PCB model 800 is used from FIG. 8(a) in FIG. 9(a). Via model 910 of FIG. 9(b) includes a first differential pair with input 911 and output 913, and a second differential pair with input 912 and output at 914. The respective differential pair vias are placed in a broadside coupled configuration. PCB model 800 data and via model 910 data are cascaded, where output 803 of PCB model connects to input 911 of via model and output 804 of PCB model connects to input 912 of via model, to observe the total accumulated FEXT. Graph 920 of FIG. 9(c) shows FEXT in the frequency domain of microstrip model 921, broadside-coupled vias model 922 and cascaded microstrip-to-broadside-coupled vias 923. As illustrated in graph 920, the total FEXT is reduced. Graph 930 of FIG. 9(d) shows FEXT in the time domain of microstrip model 931, broadside-coupled via model 932 and cascaded-microstrip-to-broadside-coupled vias 933. Since microstrip and via crosstalk FEXT are in opposite polarity, accumulated FEXT may become significantly smaller.

FIG. 10 illustrates example variables of via configuration that can have influences on magnitude and polarity of via FEXT, in accordance with an example implementation. FIG. 10 represents a 3D image of the broadside via layout 501 from FIG. 5(b) and zooms in to two adjacent differential pairs. Vias 1003 and 1004 represent a first differential pair and vias 1005 and 1006 represent a second differential pair. The first differential pair is routed on top of the PCB using microstrips 516 and connects to connector pads (not shown) and routed through the PCB using striplines 526. Second differential pair is routed on top of the PCB using microstrips 517 and connects to connector pads (not shown) and routed through the PCB using striplines 527.

Spacing between the first differential pair vias and the second differential pair vias 1007 controls the magnitude of the negative FEXT. Increased spacing produces a smaller magnitude and reduced spacing produces a larger magnitude. The depth of via 1008 also controls the magnitude of the negative FEXT. Deeper vias yield a larger magnitude and shallow vias yield a smaller magnitude. Spacing between two signal vias 1009 of a differential pair controls coupling within a pair, which influences coupling strength between adjacent differential pairs. Tight via coupling within a pair shows less crosstalk with adjacent pair and loosely coupled vias within a pair shows a larger crosstalk with an adjacent pair. Offset 1010 or offset angle 1015 between first and second differential pairs controls the magnitude and polarity of via FEXT. When offset angle 1015 is swept from 0 to 90°, FEXT goes from a negative value to a positive value. Note that 0° offset produces largest negative FEXT and 90° offset produces largest positive FEXT. At some angle 1015, polarity transitions from negative to positive, and at that transition angle, FEXT of vias between adjacent pairs is extremely small.

The above mentioned variables are not the only available ones, but have been found to vary FEXT. The variables can be useful in controlling the magnitude of via FEXT needed to offset FEXT of the connector. For example, suppose a connector is showing large positive polarity FEXT and via spacing 1007 between the first and second pairs, which can be determined by connector pin pitch, is not close enough to produce a negative value needed to offset a connector FEXT. One can consider routing at deeper layer inside a PCB by using a longer via 1008, increased spacing 1009 between intra pair vias, or even reduced inter pair via spacing 1007, if possible. On the other hand, if via FEXT is too strong, one can consider decreasing intra pair via spacing 1009, or adding an offset 1010.

FIG. 11 illustrates an example implementation of the via design as applied to high speed, short stacking height, surface mount (SMT) type connector 204. Model 501 incorporates broadside-coupled vias where spacing 1007 between adjacent channels is 1.5 mm, derived from 0.5 mm connector pin pitch and Ground-Signal-Signal-Ground (GSSG) configuration, and routing layer is 0.3 mm below top surface of PCB. Model 501 data are cascaded with connector 204 model at each end.

FIG. 12(a) illustrates a PCB pad layout in accordance with an example implementation. FIGS. 12(b) and 12(c) illustrate graphs of differential FEXT in frequency domain and time domain for connector-only, via-only and via-connector-via cascaded models, in accordance with an example implementation. PCB pad layout 1220 of FIG. 12(a) shows connector pin assignments where the first row of differential signals includes pairs 1221, 1222 and 1223 with a ground pad assigned between two consecutive pairs, and the second row of differential signals comprises of pairs 1224, 1225 and 1226 with a ground pad assigned between two consecutive pairs. In assigning pair 1221 as victim, the largest crosstalk in most cases comes from adjacent pairs 1222 and 1223. For this reason, the present via design in example implementations aims to control crosstalk of adjacent pair vias to offset connector crosstalk appearing from adjacent pairs. In most cases, connector crosstalk is larger. Graph 1200 of FIG. 12(*b*) shows FEXT in the frequency domain of connector 1201, broadside-coupled via 1202 and cascaded broadside via-connector-broadside via 1203 models. The total FEXT of the connector with improved vias may be noticeably reduced from connector only data. Graph 1210 of FIG. 12(*c*) shows FEXT in the time domain of connector 1211, broadside-coupled via 1212 and cascaded broadside via-connector-broadside via 1213 models. Connector 1211 and broadside vias 1212 have FEXT in opposite polarity, and hence, cancellation takes place after summation.

FIG. 13(*a*) illustrates pairs in accordance with an example implementation. FIG. 13(*b*) illustrates the SMT type connector in accordance with an example implementation. FIG. 13(*c*) illustrates a graph of insertion loss-to-crosstalk ratio (ICR) of connector with and without via models cascaded. The five closest FEXT aggressor pairs of FIG. 13(*a*) 1224, 1225, 1226, 1222 and 1223 are taken into consideration. Victim pair 1221 was chosen in the middle of first row. Graph 1300 of FIG. 13(*c*) plots the ICR curves of connector only 1301, broadside-coupled vias cascaded with connector 1302, and conventional via 500 cascaded with connector 1303, along with the extrapolated IEEE 802.3ap 10GBASE-KR spec. It is desirable to have a larger ICR, so higher values along the vertical axis are preferred. With related art vias 1303, which are optimized in this example, the ICR is slightly worse than the connector-only case 1301. However, it is likely to be noticeably worse in actual implementation since via crosstalk may not be fully optimized due to non-SI constraints. With the implementation of broadside vias 1302, ICR improves over the connector-only 1301 case, indicating that FEXT was reduced by cascading broadside-coupled via model to a connector model.

FIG. 14 illustrate an example implementation of the via design as applied to a high speed, tall stacking height, surface mount (SMT) type connector. Model 501 incorporates broadside-coupled vias where spacing 1007 between adjacent channels is 1.3 mm, which is slightly reduced from conventional spacing using 0.5 mm connector pin pitch and GSSG configuration, and routing layer is 0.65 mm below top surface of PCB. Model 501 data are cascaded with connector 1400 model at each end as shown.

FIG. 15(*a*) illustrates pairs in accordance with an example implementation. FIGS. 15(*b*) and 15(*c*) illustrates differential FEXT in the frequency domain and the time domain for connector-only, via-only and via-connector-via cascaded models, in accordance with an example implementation. PCB pad layout 1520 of FIG. 15(*a*) shows connector pin assignments where the first row of differential signals includes pairs 1521, 1522 and 1523 with a ground pad assigned between two consecutive pairs, and second row of differential signals includes pairs 1524 and 1525, with a ground pad assigned between two consecutive pairs. In assigning 1521 as the victim, the largest crosstalk in most cases come from adjacent pairs 1522 and 1523. For this reason, as stated in previous example, the present via design in example implementations aims to control crosstalk of adjacent pair vias to offset connector crosstalk appearing from adjacent pairs. Graph 1500 of FIG. 15(*b*) shows FEXT in the frequency domain of connector 1501, broadside-coupled via 1502 and cascaded broadside via-connector-broadside via 1503 models. The total FEXT of the connector with the improved vias may be significantly reduced from connector-only data. Graph 1510 of FIG. 15(*c*) shows FEXT in the time domain of connector 1511, broadside-coupled via 1512 and cascaded broadside via-connector-broadside via 1513 models. Connector 1511 and broadside vias 1512 have FEXT in opposite polarity, and hence, cancellation takes place after the summation.

FIG. 16(*a*) illustrates pairs in accordance with an example implementation. FIG. 16(*b*) illustrates a graph of insertion-loss-to-crosstalk ratio (ICR) of connector with and without via models cascaded, in accordance with an example implementation. The four closest FEXT aggressor pairs 1524, 1525, 1522, and 1523 as illustrated in FIG. 16(*a*) are taken into consideration. In this example, victim pair 1521 is chosen in the middle of the first row. Graph 1600 of FIG. 16(*b*) plots ICR curves of connector only 1601, broadside-coupled vias cascaded with connector 1602, and conventional via 500 cascaded with connector 1603, along with the extrapolated IEEE 802.3ap 10GBASE-KR spec. With related art vias 1603, which is optimized in this example, ICR is slightly worse than connector-only case 1601. With the implementation of broadside vias 1602, ICR improves significantly over connector-only 1601 case, indicating that FEXT cancellation occurred by cascading the broadside-coupled via model to a connector model.

FIGS. 17(*a*) to 17(*d*) illustrate an example implementation as applied to an electrical connector having negative polarity FEXT and via design having positive FEXT. Connector 1700 of FIG. 17(*a*) houses two rows of signal conductors 1710 as illustrated in FIG. 17(*b*) with an end view 1701. First differential pair located on first row 1711 and second differential pair located on second row 1712 are in a broadside coupling configuration as indicated by 1715, and produces negative polarity FEXT. The PCB layout 1720 of FIG. 17(*c*) illustrates a related art via layout where pair 1711 from the connectors is mounted onto pads 1727 and pair 1712 from the connector mounts onto pads 1728 for routing. Respective vias 1725 and 1726 are spaced apart and no major cumulative crosstalk degradation is expected. PCB layout 1730 of FIG. 17(*d*) illustrates an example implementation of the present disclosure where pair 1711 from the connectors is mounted onto pads 1737 and pair 1712 from the connector mounts onto pads 1738 for routing. The respective vias 1735 and 1736 are positioned so that first differential pair 1711 and second differential pair 1712 follow edge-coupling configuration, which produces positive FEXT and offsets negative FEXT incurred inside the connector.

FIGS. 18(*a*) and 18(*b*) illustrate an example implementation as applied to a ball grid array (BGA) connector and its routing via design. The BGA connector 1800 of FIG. 18(*a*) has multiple rows, 1811, 1812, and so on, of signal conductors. First row 1811 contains a first differential pair signal conductors 1813 and 1814, a second differential pair signal conductors 1815 and 1816, and so on, as can be seen from zoomed image of 1801. Differential pairs of each row are edge coupled. PCB layout 1820 of FIG. 18(*b*) illustrates each connector row of signals forming a broadside coupling at via routing. First row 1811 contains first differential pair BGA contact pads 1821 and 1822 that mate with connector conductors 1813 and 1814, a second differential pair BGA contact pads 1825 and 1826 that interfaces connector conductors 1815 and 1816. The first differential pair of row 1811 forms a broadside configuration with the second differential pair of row 1811 by using via-in-pad for the first BGA pad 1821 and 1825 of each differential pair, and dog-bone pad to route second BGA pad 1822 and 1826 of each differential pair out to via pad 1823 and 1827. The vias of first differential pair of row 1811 are located at 1821 and 1823, and the vias of second differential pair of row 1811 are located at 1825 and 1827, hence forming a broadside coupling that facilitates FEXT cancellation. This illustration serves as an example and it's not necessary to follow the exact configuration to form the broadside via configuration.

FIGS. 19(a) to 19(b) illustrate related art configurations and FIGS. 19(c) to 19(d) illustrate example implementations as applied to an electrical connector. Related art configuration 1900 of FIG. 19(a) shows an edge coupled connector signal conductor 1905 configuration. Receptacle side 1906 and plug side 1907 are mated at 1904 as shown. In the related art, the geometry of the mating section is defined by a standard committee and modifications cannot be made. Plug side 1907 signal conductors interface with cables 1903 at cable termination 1902. Insert molding 1912, of connector side view 1910 of FIG. 19(b), molds over connector conductors and connector shell 1917 encapsulates the mold. Connector shell 1916 encapsulates receptacle side 1906 of the connector. Differential FEXT from neighbor aggressors to a victim pair 1901 is expected to have positive polarity.

Example implementation configuration 1950 of FIG. 19(c) illustrates an implementation within a connector by applying both edge-coupling 1955 and broadside coupling 1965 to signal conductors. Receptacle side 1956 and plug side 1957 are mated at 1954 as shown. Plug side 1957 signal conductors interface with cables 1953 at cable termination 1952. Insert molding 1962, of connector side view 1960 of FIG. 19(d), molds over connector conductors and connector shell 1967 encapsulates the mold. Differential FEXT from neighbor aggressors to a victim pair 1951 is expected to have small magnitude due to sequence of edge coupling 1955 and broadside coupling 1965 configurations. With optimum coupling length of each configuration, magnitude of both polarities will be similar and cumulative FEXT of the connector will be reduced.

Other implementations of the present application will be apparent to those skilled in the art from consideration of the specification and practice of the example implementations disclosed herein. Various aspects and/or components of the described example implementations may be used singly or in any combination. It is intended that the specification and examples be considered as examples, with a true scope and spirit of the application being indicated by the following claims.

The invention claimed is:

1. An electrical system, comprising:
a first electrical component having a differential far end crosstalk (FEXT) of a first polarity; and
a second electrical component coupled to the first electrical component and having a differential FEXT of a second polarity;
wherein the first polarity is an opposite polarity of the second polarity so as to produce FEXT cancellation;
wherein the first electrical component comprises a printed circuit board comprising at least two pairs of signal vias, wherein the second electrical component comprises an electrical connector comprising a plurality of signal conductors, and wherein the at least two pairs of signal vias are connected to at least two pairs of signal pads configured to be mounted by the plurality of signal conductors of the electrical connector.

2. The electrical system of claim 1, wherein a first pair of the at least two pairs of signal vias is arranged at a first location relative to a second pair of the at least two signal vias such that a polarity of at least one of the first pair and the second pair of the at least two signal vias has an opposite differential FEXT polarity of a differential FEXT polarity of at least one pair of the plurality of signal conductors.

3. The electrical system of claim 1, wherein the first electrical component is coupled to the second electrical component by a surface mount.

4. The electrical system of claim 1, wherein the first electrical component is coupled to the second electrical component by a ball grid array (BGA).

5. The electrical system of claim 1, wherein the plurality of signal conductors are connected to an edge coupling via structure configured to induce a positive differential FEXT.

6. The electrical system of claim 1, wherein the plurality of signal conductors are connected to a broadside coupling via structure configured to induce a negative differential FEXT.

7. The electrical system of claim 1, wherein one of the first electrical component and the second electrical component comprises a broadside coupling via structure configured to induce a negative differential FEXT, and wherein another one of the first electrical component and the second electrical component comprises an edge coupling via structure configured to induce a positive differential FEXT.

8. The electrical system of claim 1, wherein one of the first electrical component and the second electrical component comprises a broadside coupling via structure configured to induce a negative differential FEXT.

9. The electrical system of claim 1, wherein one of the first electrical component and the second electrical component comprises an edge coupling via structure configured to induce a positive differential FEXT.

10. The electrical system of claim 1, wherein the electrical system comprises a connector, wherein the first electrical component comprises a first portion of the connector having an edge coupling structure configured to induce a positive differential FEXT polarity, wherein the second electrical component comprises a second portion of the connector having a broadside coupling structure configured to induce a negative differential FEXT, resulting in FEXT cancellation of the positive differential FEXT polarity induced in the first portion of the connector.

11. A printed circuit board (PCB) comprising at least two pairs of signal vias electrically connected to at least two pairs of signal pads on which signal conductors of an electrical connector are mounted:
wherein a first pair of the at least two pairs of signal vias is arranged at a location relative to a second pair of the at least two pairs of signal vias, wherein a polarity of differential FEXT caused by an aggressor via pair that is one of the first pair and the second pair is opposite to a polarity of differential FEXT caused by an aggressor signal conductor of the signal conductors;
wherein the first pair is arranged at the location relative to the second pair such that a polarity of at least one of the first pair and the second pair of the PCB has an opposite differential FEXT polarity of a differential FEXT polarity of at least one pair of the signal conductors of the electrical connector.

12. The PCB of claim 11, wherein the first pair comprises an input differential port comprising a first input port and a second input port, wherein the second pair comprises an output differential port comprising a first output port and a second output port; wherein the first pair and the second pair are arranged such that differential FEXT from the input differential port to the output differential port are based on a difference between:
a sum of first single-ended scattering parameters from the first input port to the first output port, and a second single-ended scattering parameters from the second input port to the second output port; and a sum of third single-ended scattering parameters from the first input port to the second output port, and a second single-ended scattering parameters from the second input port to the first output port.

13. The PCB of claim 11, wherein the signal conductors are connected to an edge coupling via structure of the PCB configured to induce a positive differential FEXT.

14. The PCB of claim 11, wherein the signal conductors are connected to a broadside coupling via structure of the PCB configured to induce a negative differential FEXT.

15. The PCB of claim 11, wherein the PCB is coupled to the signal conductors by a surface mount.

16. The PCB of claim 11, wherein the PCB is coupled to the signal conductors by a ball grid array (BGA).

* * * * *